(12) United States Patent
Sim et al.

(10) Patent No.: US 8,142,986 B2
(45) Date of Patent: Mar. 27, 2012

(54) METHOD OF FORMING FINE PATTERNS OF SEMICONDUCTOR DEVICE

(75) Inventors: Jae-hwang Sim, Seoul (KR); Sang-yong Park, Gyeonggi-do (KR); Young-ho Lee, Seoul (KR)

(73) Assignee: Samsung Electronics, Co., Ltd. (KR)

( * ) Notice: Subject to any disclaimer, the term of this patent is extended or adjusted under 35 U.S.C. 154(b) by 894 days.

(21) Appl. No.: 12/192,430

(22) Filed: Aug. 15, 2008

(65) Prior Publication Data
US 2009/0263749 A1 Oct. 22, 2009

(30) Foreign Application Priority Data
Apr. 17, 2008 (KR) .................. 10-2008-0035819

(51) Int. Cl.
*G03F 7/20* (2006.01)
(52) U.S. Cl. ...................................... 430/313
(58) Field of Classification Search .................. 430/311, 430/313, 319
See application file for complete search history.

(56) References Cited

U.S. PATENT DOCUMENTS

| | | | |
|---|---|---|---|
| 7,253,118 B2 * | 8/2007 | Tran et al. | 438/717 |
| 2009/0097017 A1 * | 4/2009 | Brodsky et al. | 356/237.2 |
| 2009/0127722 A1 * | 5/2009 | Noelscher et al. | 257/797 |

FOREIGN PATENT DOCUMENTS

| | | |
|---|---|---|
| KR | 100642886 B1 | 10/2006 |
| KR | 1020070076793 A | 7/2007 |

* cited by examiner

*Primary Examiner* — Kathleen Duda
*Assistant Examiner* — Brittany Raymond
(74) *Attorney, Agent, or Firm* — Myers Bigel Sibley & Sajovec, P.A.

(57) ABSTRACT

A method of forming fine patterns of a semiconductor device, in which a plurality of conductive lines formed in a cell array region are integrally formed with contact pads for connecting the conductive lines to a peripheral circuit. In this method, a plurality of mold mask patterns, each including a first portion extending in a first direction and a second portion which is integrally formed with the first portion and extends in a second direction, are formed within a cell block on a substrate comprising a film which is to be etched. A first mask layer covering sidewalls and an upper surface of each of the plurality of mold mask patterns is formed on the substrate. First mask patterns are formed by partially removing the first mask layer so that a first area of the first mask layer remains and a second area of the first mask layer is removed. The first area of the first mask layer covers sidewalls of adjacent mold mask patterns from among the plurality of mold mask patterns by being located between the adjacent mold mask patterns, and the second area of the first mask layer covers portions of the sidewalls of the plurality of mold mask patterns, the portions corresponding to an outermost sidewall of a mold mask pattern block.

27 Claims, 37 Drawing Sheets

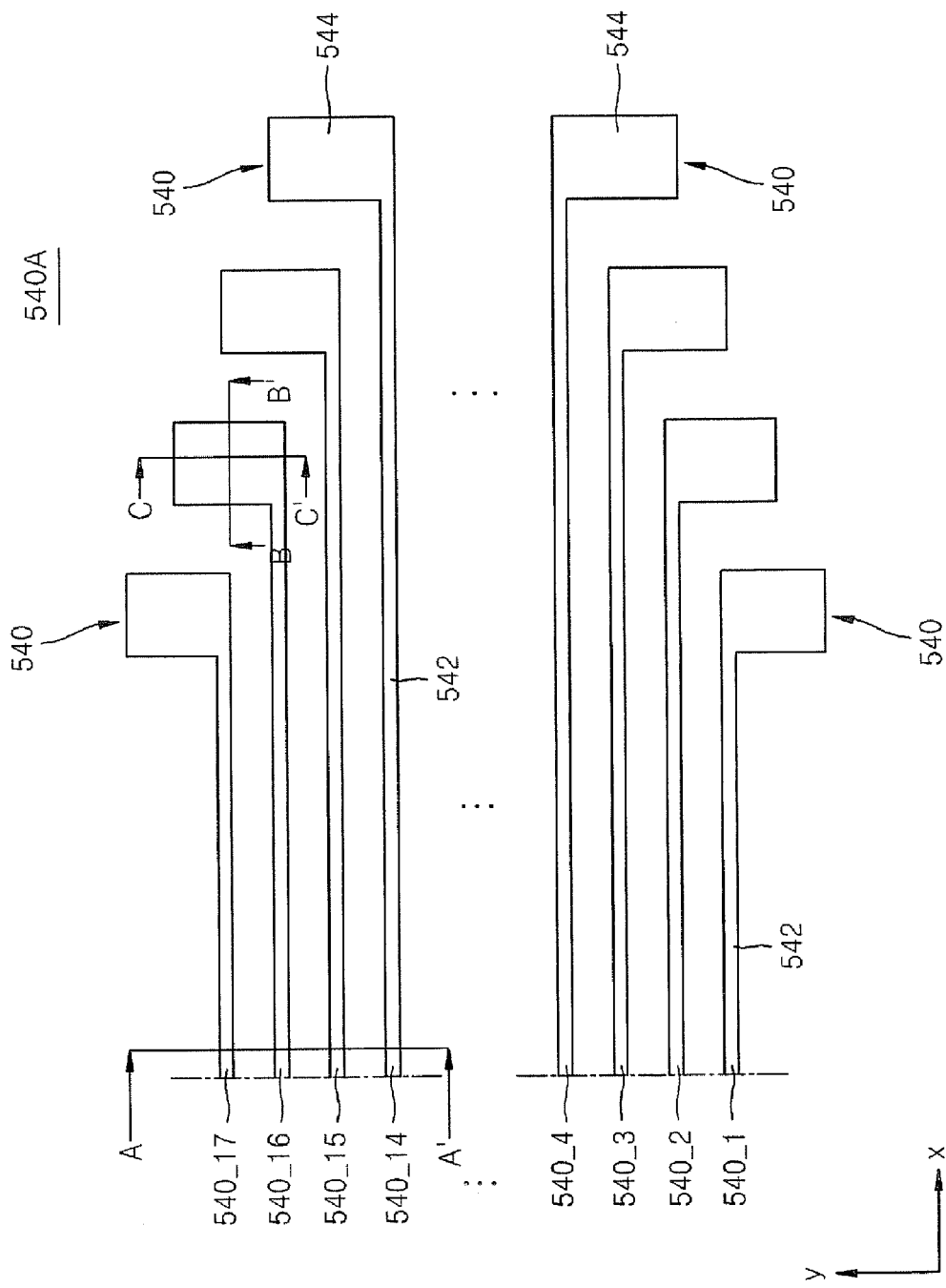

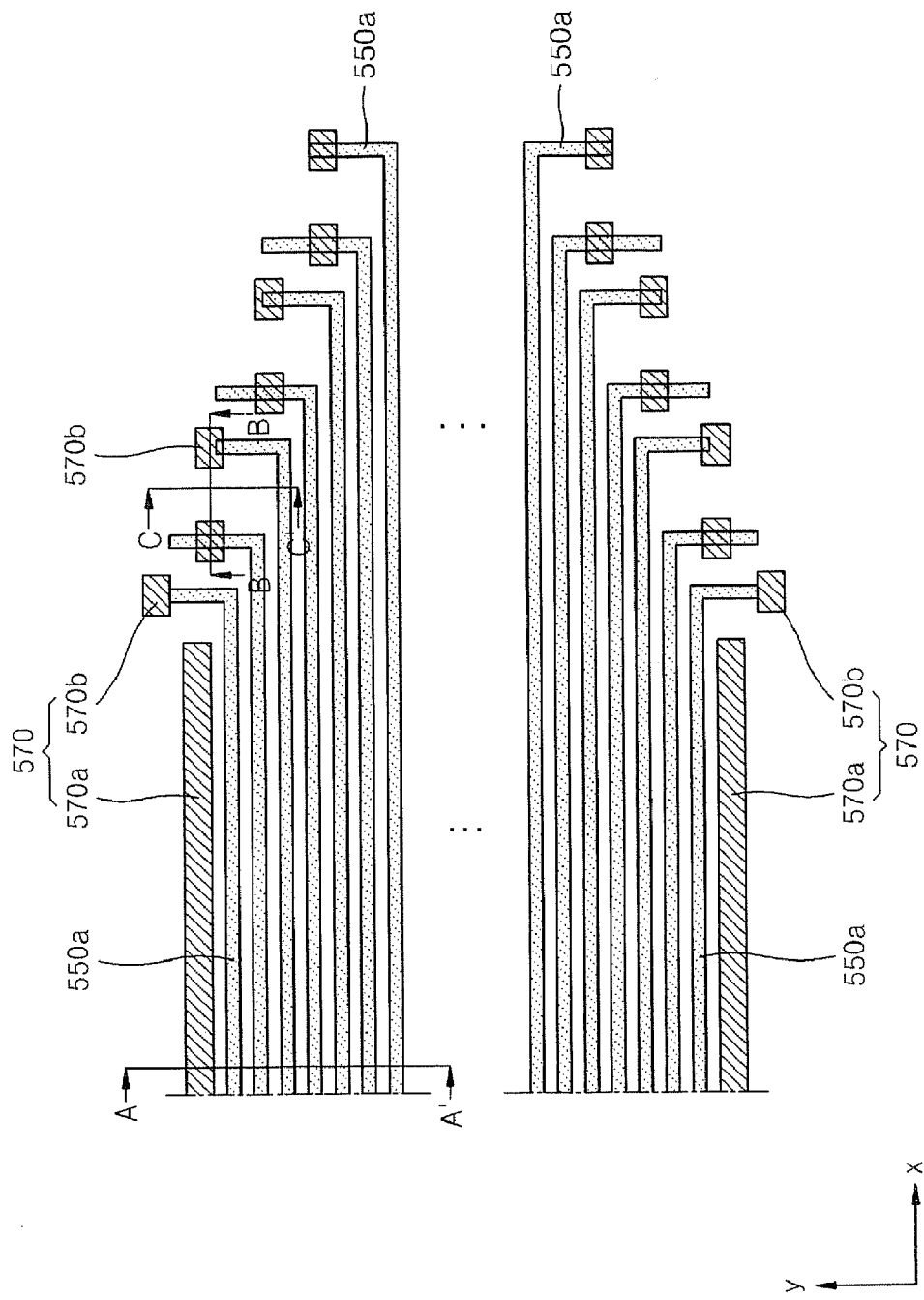

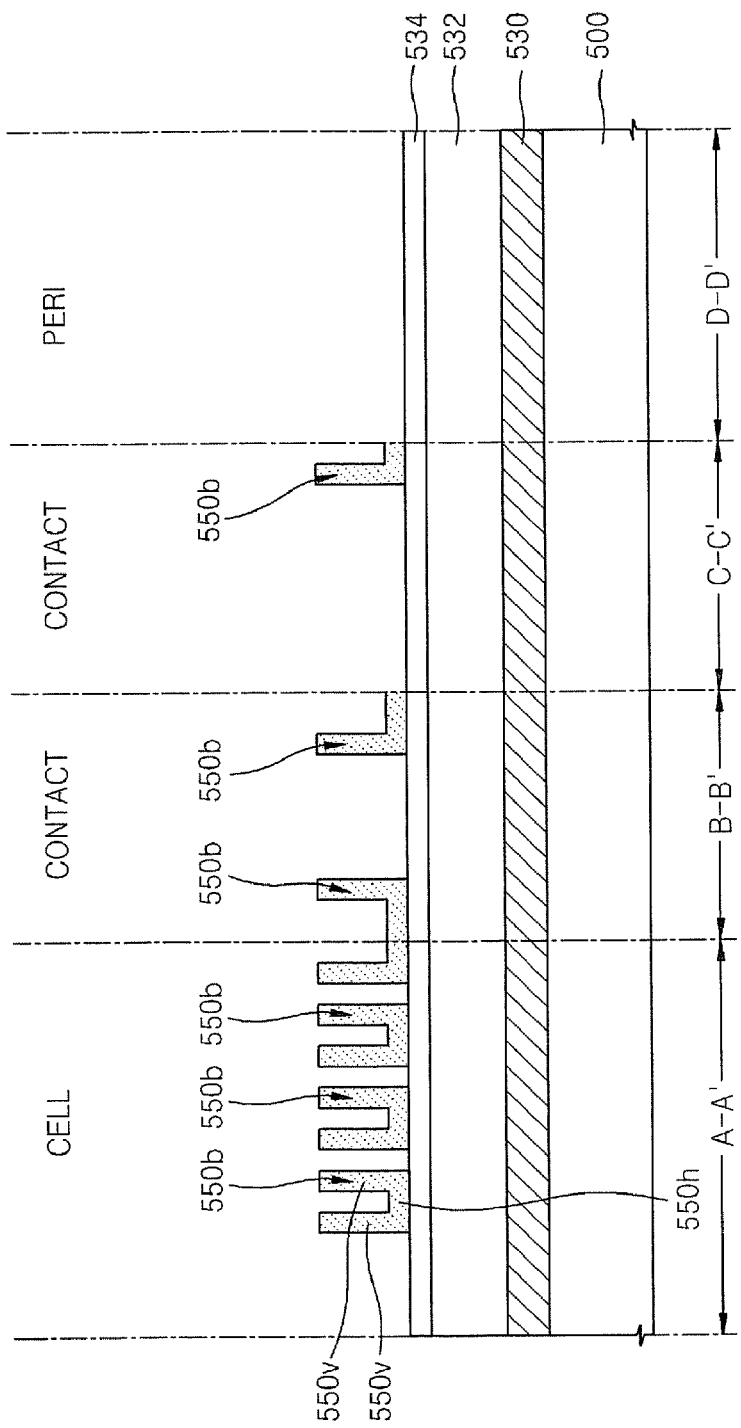

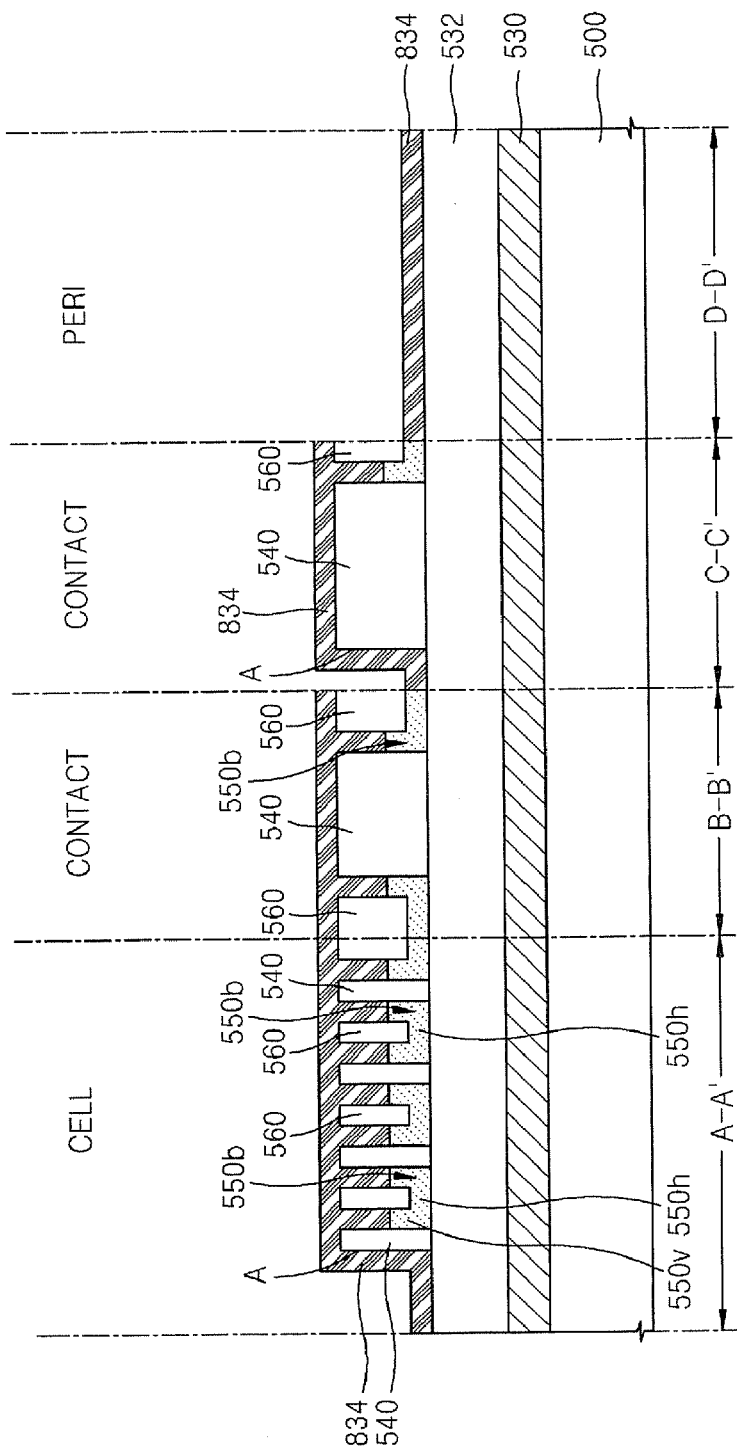

US 8,142,986 B2

METHOD OF FORMING FINE PATTERNS OF SEMICONDUCTOR DEVICE

CROSS-REFERENCE TO RELATED PATENT APPLICATION

This application claims the benefit of Korean Patent Application No. 10-2008-0035819, filed on Apr. 17, 2008, in the Korean Intellectual Property Office, the disclosure of which is incorporated herein in its entirety by reference.

BACKGROUND OF THE INVENTION

The present invention relates generally to semiconductor devices and, more particularly, to semiconductor device manufacturing.

In a cell array region of a semiconductor device, a plurality of conductive lines for defining unit cells, for example, a plurality of word lines and a plurality of bit lines, are arranged in a predetermined direction.

FIG. 1 is a block diagram of a memory cell array 100 of a conventional NAND flash memory device, which is a type of non-volatile memory device, and an X-decoder 110 and a Y-decoder 120, which are peripheral circuits of the memory cell array 100. FIG. 2 is a circuit diagram of a structure of the memory cell array 100.

Referring to FIGS. 1 and 2, the conventional NAND flash memory device includes the memory cell array 100 which includes a plurality of memory cell blocks 100A each made up of a plurality of memory cells. The X-decoder 110 selects word lines $WL_0$, $WL_1$, through to $WL_{m-1}$, and $WL_m$ of the memory cell blocks 100A, and the Y-decoder 120 selects bit lines $BL_0$, $BL_1$, through to $BL_{n-1}$, and $BL_n$ of the memory cell blocks 100A. A Y-gating 130 is connected to the Y-decoder 120 and designates paths of the bit lines of the memory cell array 100.

Each of the memory cell blocks 100A of the memory cell array 100 includes a plurality of cell strings 10 formed between the bit lines $BL_0$, $BL_1$, through to $BL_{n-1}$, $BL_n$ and a common source line CSL. Each of the cell string 10 includes a plurality of memory cells 12 connected in series. Gate electrodes of the memory cells 12 included in one cell string 10 are respectively connected to word lines $WL_0$, $WL_1$, through to $WL_{m-1}$, and $WL_m$. A ground selection transistor 14 connected to a ground selection line GSL is disposed on one end of each of the cell strings 10 and a string selection transistor 16 connected to a string selection line SSL is disposed on the other end of each of the cell strings 10. The ground selection transistor 14 and the string selection transistor 16 control electrical connections between the memory cells 12 and the bit lines $BL_0$, $BL_1$, through to $BL_{n-1}$, and $BL_n$ and the common source line CSL. The memory cells 12 connected to each of the word lines $WL_0$, $WL_1$, through to $WL_{m-1}$, and $WL_m$ across the cell strings 10 form a page unit or a byte unit.

In the NAND flash memory device of FIGS. 1 and 2, in order to perform a read operation or a write operation by selecting a predetermined memory cell, the predetermined memory cell is selected by selecting the word line $WL_0$, $WL_1$, through to $WL_{m-1}$, and $WL_m$ and the bit line $BL_0$, $BL_1$, through to $BL_{n-1}$, and $BL_n$ by using the X-decoder 110 and the Y-decoder 120.

A NAND flash memory device has a high integration density since the NAND flash memory device has a structure in which a plurality of memory cells are connected in series. However, recently, further reduction of the design rule of the NAND flash memory device is required in order to shrink the chip size. Also, as the design rule is reduced, the minimum pitch of patterns required for constituting the NAND flash memory device is also greatly reduced. In order to realize a minute pattern that meets the reduced design rule, various methods of forming patterns are employed. In particular, in order to realize a cell array structure of NAND flash memory devices that is difficult to realize using only exposure equipment and exposure technology that are provided by current lithography techniques, a double patterning technique for repeatedly forming a plurality of patterns by using a minute pitch that transcends the limits of conventional lithography techniques has been proposed.

In a conventional NAND flash memory device, a contact pad for connecting the word lines $WL_0$, $WL_1$, through to $WL_{m-1}$, and $WL_m$ to the X-decoder 110 is integrally formed with the word lines $WL_0$, $WL_1$, through to $WL_{m-1}$, and $WL_m$. The contact pad is formed at the same time as when the word lines $WL_0$, $WL_1$, through to $WL_{m-1}$, and $WL_m$ are formed. Thus, when the word lines $WL_0$, $WL_1$, through to $WL_{m-1}$, and $WL_m$ are formed using the double patterning technique, a trimming process for removing undesired portions of fine patterns unnecessarily formed around the contact pad for connection to a peripheral circuit is also performed. The same trimming process is also applied to a case in which a contact pad for connecting the bit lines $BL_0$, $BL_1$, through to $BL_{n-1}$, and $BL_n$ to the Y-decoder 120 is integrally formed with the bit lines $BL_0$, $BL_1$, through to $BL_{n-1}$, and $BL_n$.

However, in such a conventional NAND flash memory device, a configuration of contact pads for peripheral circuit connections connected to word lines and bit lines is minute and complicated, and thus, a layout of a mask pattern for this trimming process is complicated. In particular, the design rule of the NAND flash memory device is greatly reduced according to a recent market demand, and pattern sizes of word lines and bit lines that constitute the NAND flash memory device are becoming more minute, and accordingly, the configuration of the contact pads for peripheral circuit connections connected to the word lines and the bit lines become even more minute and complicated. Thus, the layout of a mask pattern for a trimming process is also minute and complicated. Also, since the pitch between minute patterns formed by the double patterning technique is very small, when a mask pattern for trimming is formed, a tolerance of an alignment error between the minute patterns formed by double patterning and the mask pattern is very strict. Thus, due to the possibility of misalignment occurring during performance of an aligning process and due to various parameters used in an etching process, problems such as removal of patterns in necessary regions or generation of undesired shapes of patterns after a trimming process may be generated.

SUMMARY OF THE INVENTION

The present invention provides a method of forming fine patterns of a semiconductor device, in which, when conductive lines for defining a cell array region of the semiconductor device are integrally formed with contact pads for connecting the conductive lines to a peripheral circuit, fine conductive patterns designed at high density can be formed with various pitches according to a reduced design rule by simplifying a trimming process for removing unnecessary portions.

According to an aspect of the present invention, there is provided a method of forming fine patterns of a semiconductor device. In this method, first, a mold mask pattern block is formed by arranging a plurality of mold mask patterns parallel to each other within a cell block on a substrate comprising a film which is to be etched, wherein each of the mold mask patterns comprises a first portion extending in a first direction and a second portion which is integrally formed with the first portion and extends in a second direction different from the first direction. Then, a first mask layer covering sidewalls and an upper surface of each of the plurality of mold mask patterns is formed on the substrate. Thereafter, first mask patterns are formed by partially removing the first mask layer so that a first area of the first mask layer remains and a second area of the first mask layer is removed, wherein the first area of the first mask layer covers sidewalls of adjacent mold mask patterns from among the plurality of mold mask patterns by being located between the adjacent mold mask patterns, and the second area of the first mask layer covers portions of the sidewalls of the plurality of mold mask patterns, the portions corresponding to an outermost sidewall of the mold mask pattern block.

The first mask layer may comprise two vertical extensions covering sidewalls of the adjacent mold mask patterns by being located between the adjacent mold mask patterns and a horizontal extension formed on the film to be etched between the two vertical extensions so that the two vertical extensions are connected to each other.

In an embodiment, the forming of the first mask patterns may comprise forming a plurality of mask spacers covering sidewalls of the plurality of mold mask patterns by removing the horizontal extensions by etching back the first mask layer after forming the first mask layer; forming a gap-fill protection film that fills gaps between adjacent mask spacers which exist between the adjacent mold mask patterns; removing portions of the plurality of mask spacers, which are not covered by the gap-fill protection film; and removing the gap-fill protection film.

In another embodiment, after the first mask layer is formed, recesses having widths each defined by two vertical extensions connected to a horizontal extension of the first mask layer may be formed on the horizontal extension between adjacent mold mask patterns of the plurality of mold mask patterns. In this embodiment, the forming of the first mask patterns may comprise forming the gap-fill protection film which fills the recesses by being located between the two adjacent mold mask patterns, after the first mask layer is formed; removing a portion of the first mask layer, which is not covered by the gap-fill protection film; and removing the gap-fill protection film. In this embodiment, the method may further comprise removing the horizontal extensions of the first mask layer so that the film that is to be etched is exposed between the adjacent vertical extensions connected to each of the horizontal extensions, after the gap-fill protection film is removed.

In another embodiment, after the first mask layer is formed, recesses having widths each defined by two vertical extensions connected to a horizontal extension of the first mask layer may be formed on the horizontal extension between adjacent mold mask patterns of the plurality of mold mask patterns. In this embodiment, the forming of the first mask patterns may comprise forming the gap-fill protection film which fills the recesses by being located between the two adjacent mold mask patterns, after the first mask layer is formed; removing a portion of the first mask layer, which is not covered by the gap-fill protection film; forming mask spaces each having a first depth between the mold mask patterns and the gap-fill protection film, by partially removing the vertical extensions of the mask layer starting from upper surfaces of the vertical extensions, when the gap-fill protection film remains in the recesses; and forming upper mask patterns within the mask spaces. In the forming of the mask spaces, the vertical extensions of the first mask layer may be removed so that a distance from the substrate to a bottom surface of each of the mask spaces is greater than a distance from the substrate to a bottom surface of the gap-fill protection film. The upper mask patterns may be formed of a material different from materials used to form the mold mask patterns, the gap-fill protection film, and the mask layer.

The method may further comprise forming second mask patterns comprising first local patterns and second local patterns on the substrate after the first mask patterns are formed, wherein the first local patterns do not cover the first mask patterns and the second mask patterns cover the first mask patterns.

The substrate may comprise a memory cell region, a peripheral circuit region, and a contact region located between the memory cell region and the peripheral circuit region. The first local patterns of the second mask patterns may be formed in the memory cell region and the peripheral circuit region. The second local patterns of the second mask patterns may be formed in the contact region.

The method may further comprise completely removing the plurality of mold mask patterns after the first mask patterns are formed but before the second mask patterns are formed.

The method may further comprise etching the film that is to be etched, by using the first and second mask patterns as an etch mask.

The first mask patterns may be comprised of a plurality of mask spacers that cover sidewalls of adjacent mold mask patterns of the plurality of mold mask patterns by being located between the adjacent mold mask patterns. Adjacent mask spacers between the adjacent mold mask patterns may be separated apart from each other by having a space exposing the film that is to be etched between the adjacent mask spacers. In this case, in order to form N mask spacers (where N is a natural number) within the cell block in the forming of the first mask patterns, a mold mask pattern block comprising $\{(N+2)/2\}$ mold mask patterns may be formed within the cell block in the forming of the mold mask pattern block.

According to another aspect of the present invention, there is provided a method of forming fine patterns of a semiconductor device, the method comprising arranging a plurality of mold mask patterns parallel to each other on a substrate comprising a film which is to be etched, wherein each of the plurality of mold mask patterns comprises a first portion extending in a first direction and a second portion which is integrally formed with the first portion and extends in a second direction different from the first direction; forming a plurality of loop-shaped mask spacers covering sidewalls of the plurality of mold mask patterns so as to be separated from each other; and forming first mask patterns by partially removing the plurality of mask spacers so that sidewalls of portions of the plurality of mold mask patterns, not facing other mold mask patterns, are exposed.

BRIEF DESCRIPTION OF THE DRAWINGS

The above and other features and advantages of the present invention will become more apparent by describing in detail exemplary embodiments thereof with reference to the attached drawings in which:

FIGS. 5A through 5F are plan views of layouts of a major part of the semiconductor device of FIG. 3 that are explained in processes of FIGS. 4A through 4K;

FIGS. 6A through 6F are cross-sectional views for explaining a method of forming fine patterns of the semiconductor device of FIG. 3, according to a second embodiment of the present invention;

FIGS. 8A through 8I are cross-sectional views for explaining a method of forming fine patterns of the semiconductor device of FIG. 3, according to a fourth embodiment of the present invention.

DETAILED DESCRIPTION OF THE INVENTION

Figure 1:
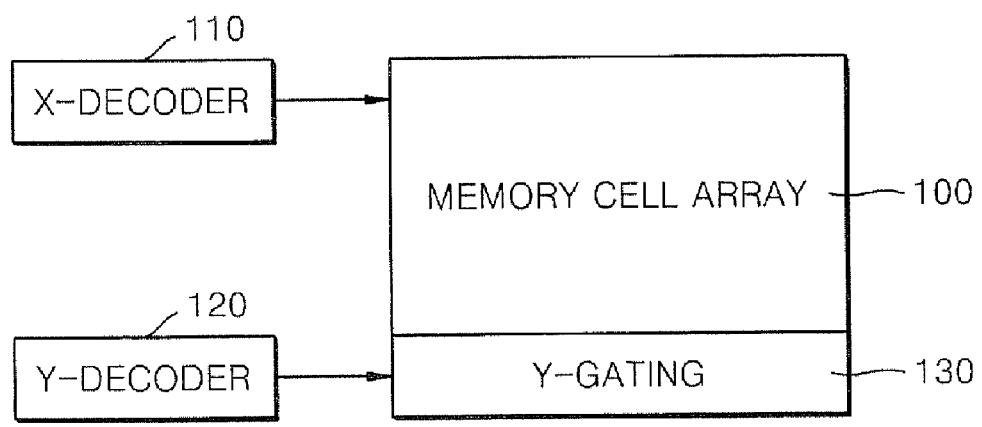
FIG. 1 is a block diagram of a memory cell array of a conventional NAND flash memory device and peripheral circuits of the memory cell array.

The present invention is described more fully hereinafter with reference to the accompanying drawings, in which example embodiments of the invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to," "coupled to" or "responsive to" another element or layer, it can be directly on, connected, coupled or responsive to the other element or layer or intervening elements or layers may be present. In contrast, when an element is referred to as being "directly on," "directly connected to," "directly coupled to" or "directly responsive to" another element or layer, there are no intervening elements or layers present. Like numbers refer to like elements throughout. As used herein, the term "and/or" includes any and all combinations (mixtures) of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The structure and/or the device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

It should also be noted that in some alternate implementations, the functionality of a given block may be separated into multiple blocks and/or the functionality of two or more blocks may be at least partially integrated.

Figure 3:
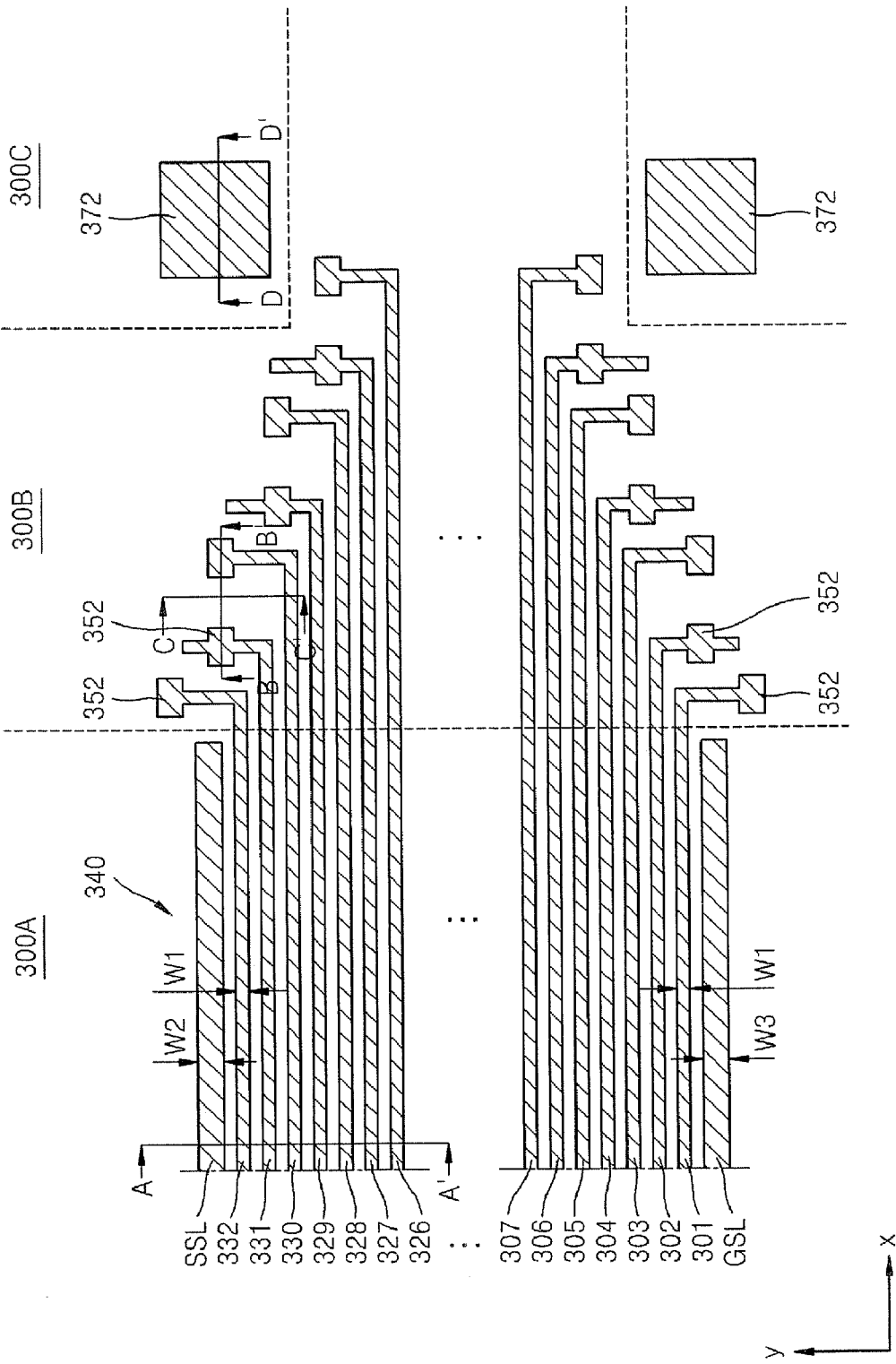
FIG. 3 is a plan view of a structure of a part of a semiconductor device that can be realized according to a method of forming fine patterns of a semiconductor device, according to an embodiment of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein. FIG. 3 is a plan view of a structure of a part of a semiconductor device that can be realized according to a method of forming fine patterns of a semiconductor device, according to an embodiment of the present invention. In FIG. 3, layouts of a part of a memory cell region 300A of a NAND flash memory device, a part of a contact region 300B for connecting a plurality of conductive lines that define a cell array of the memory cell region 300A, for example, word lines and bit lines, to an external circuit (not shown) such as a decoder, and a part of a peripheral circuit region 300C are illustrated.

Figure 2:
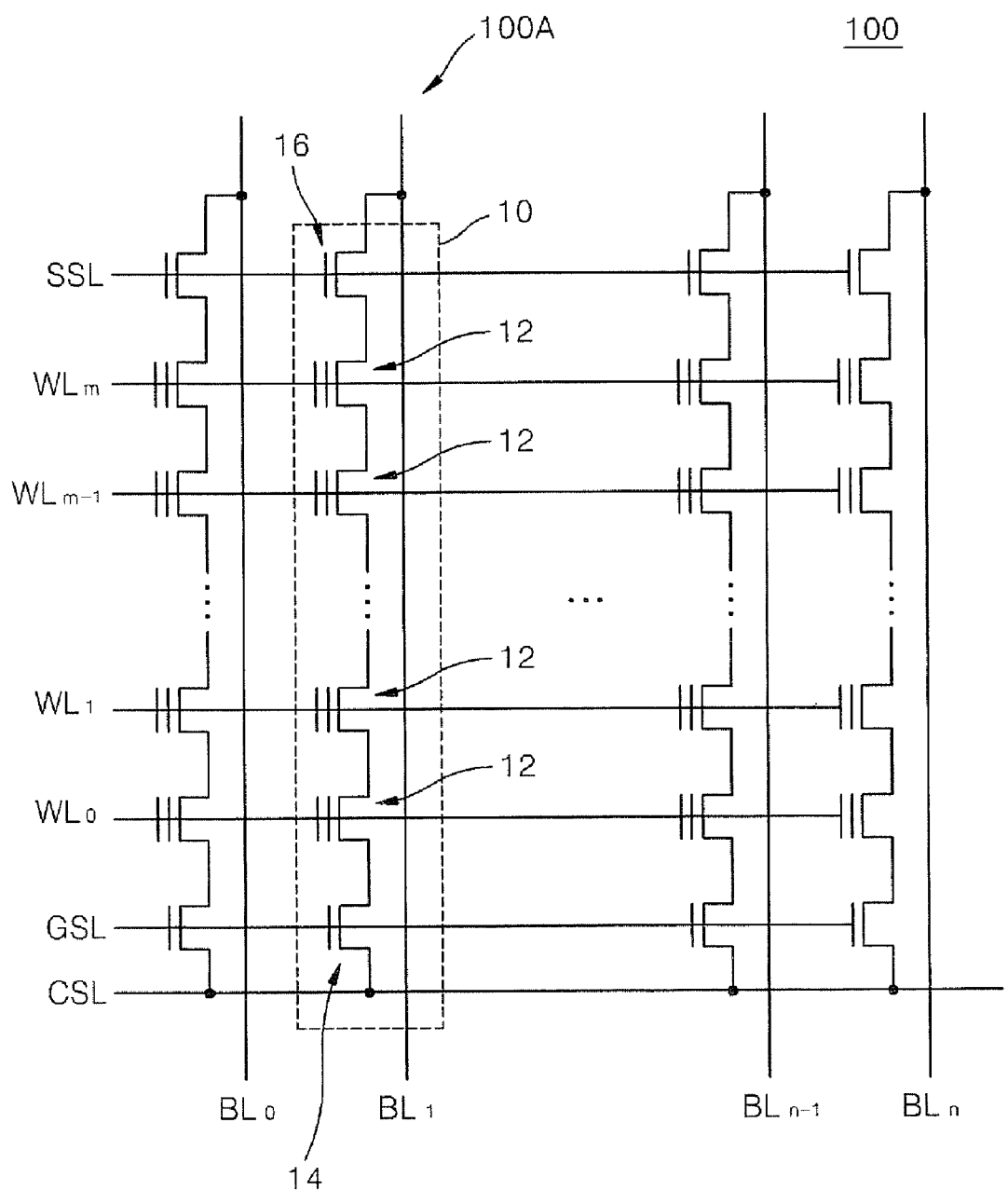
FIG. 2 is a circuit diagram of a structure of the memory cell array of the conventional NAND flash memory device.

Referring to FIG. 3, a plurality of memory cell blocks 340 are formed in the memory cell region 300A. However, only one memory cell block 340 is illustrated in FIG. 3. In the memory cell block 340, a plurality of conductive lines 301-332 constitute a single cell string 10 (see FIG. 2) and extend parallel to each other in a first direction (i.e., an x direction) between a string selection line SSL and a ground selection line GSL. The conductive lines 301-332 extend across the memory cell region 300A and the contact region 300B.

In order to connect the conductive lines 301-332 to an external circuit (not shown) such as a decoder, a plurality of contact pads 352 are integrally formed with the conductive lines 301-332 within the contact region 300B in such a way that each of the contract pads 352 is connected to an end of a corresponding one of the conductive lines 301-332.

In the contact region 300B, respective ends of the conductive lines 301-332 extend up to the contact pads 352 in a direction other than the direction in which the conductive lines 301-332 extend in the memory cell region 300A. As illustrated in FIG. 3, the respective ends of the conductive lines 301-332 within the contact region 300B extend in a second direction (i.e., a y direction of FIG. 3) perpendicular to the first direction. However, the present invention is not limited to the configuration illustrated in FIG. 3. Various modifications and changes in the configurations of the conductive lines 301-332 and the contact pads 352 may be made within the scope of the present invention.

In the peripheral circuit region 300C, a conductive pattern 372 for peripheral circuits is formed.

In FIG. 3, the conductive lines 301-332, the string selection line SSL, the ground selection line GSL, the contact pads 352, and the conductive pattern 372 for peripheral circuits are all formed of an identical material. The conductive lines 301-332 may be word lines that define a plurality of memory cells in the memory cell region 300A. The conductive pattern 372 for peripheral circuits may constitute a gate electrode of a peripheral circuit transistor. The string selection line SSL and the ground selection line GSL may have widths W2 and W3, respectively, which are greater than a width W1 of each of the conductive lines 301-332.

Alternatively, the conductive lines 301-332 may be bit lines that define the memory cells in the memory cell region 300A. In this case, the string selection line SSL and the ground selection line GSL may be omitted.

Although FIG. 3 illustrates that the single memory cell block 340 includes 32 conductive lines, namely, the conductive lines 301-332, the memory cell block 340 may include a different number of conductive lines.

Methods of forming fine patterns of the semiconductor device illustrated in FIG. 3, according to various exemplary embodiments of the present invention, will now be described in detail.

FIGS. 4A through 4K are cross-sectional views for explaining a method of forming fine patterns of the semiconductor device of FIG. 3, according to a first embodiment of the present invention.

FIGS. 5A through 5F are plan views of layouts of a major part of the semiconductor device of FIG. 3, which is explained in processes of FIGS. 4A through 4K. FIGS. 5A through 5F illustrate only the single memory cell block 340 of FIG. 3.

FIGS. 4A through 4K illustrate cross-sections taken along lines A-A', B-B', C-C', and D-D' of FIG. 3, according to a process sequence. In FIGS. 4A through 4K and FIGS. 5A through 5F, the same reference characters as those of FIG. 3 denote like elements, and thus their description will be omitted. In FIGS. 4A through 4K, the memory cell region 300A is represented as "CELL", the contact region 300B is represented as "CONTACT", and the peripheral circuit region 300C is represented as "PERI".

Figure 4A:
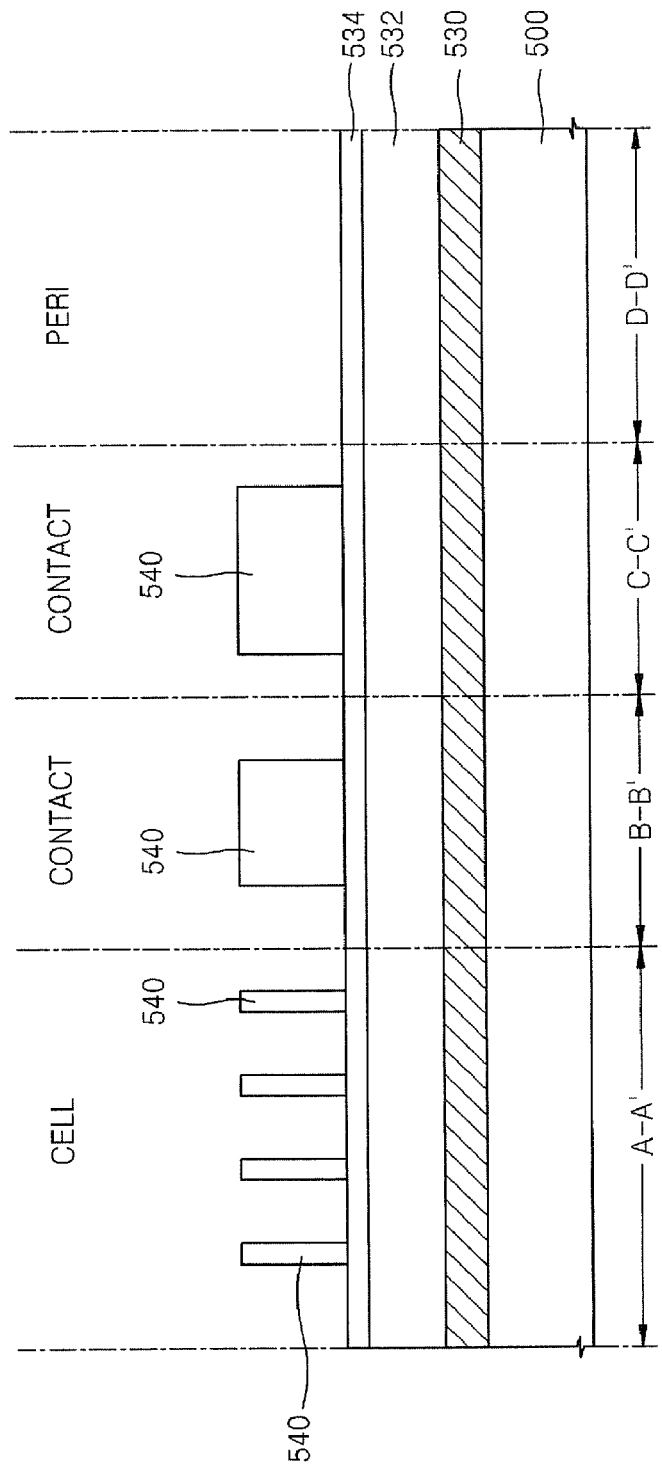
FIGS. 4A through 4K are cross-sectional views for explaining a method of forming fine patterns of the semiconductor device illustrated in FIG. 3, according to a first embodiment of the present invention.

Referring to FIGS. 4A and 5A, first, a substrate 500, for example, a silicon substrate, including the memory cell region 300A, the contact region 300B, and the peripheral circuit region 300C is prepared.

A conductive layer 530 required to form the conductive lines is formed on the substrate 500. A first hard mask layer 532 and a second hard mask layer 534 are sequentially formed on the conductive layer 530. In some cases, one of the first and second hard mask layers 532 and 534 may be omitted. Alternatively, another layer in addition to the first hard mask layer 532 and the second hard mask layer 534 may be further formed.

Thereafter, in the memory cell region 300A and the contact region 300B, a plurality of mold mask patterns 540 are formed on the second hard mask layer 534. In FIG. 5A, a single mold mask pattern block 540A required to form the single memory cell block 340 (see FIG. 3) is illustrated.

When word lines are formed from the conductive layer 530, the conductive layer 530 may be a stack of a tunneling oxide film, a charge storage layer, a blocking oxide film, and a gate electrode layer sequentially formed on the substrate 500. In this case, the tunneling oxide film may be a silicon oxide film. The charge storage layer may be a silicon nitride film, or a high-k film that has a higher dielectric constant than the silicon nitride film. For example, the charge storage layer may be a $Si_3N_4$ film, a metal oxide film, a metal nitride film, or a combination of two or more of these films. The blocking oxide film may be formed of at least one of $Al_2O_3$, $SiO_2$, $HfO_2$, $ZrO_2$, LaO, LaAlO, LaHfO, and HfAlO. The gate electrode layer may be formed of TaN, TiN, W, WN, HfN, tungsten silicide, or a combination of two or more of these materials. Alternatively, when word lines are formed from the conductive layer 530, the conductive layer 530 may be a stack of a tunneling oxide film, a conductive layer for floating gates, an inter-gate dielectric film, and a conductive layer for control gates sequentially formed on the substrate 500. The first hard mask layer 532 may be a silicon nitride film.

On the other hand, when bit lines are formed from the conductive layer 530, the conductive layer 530 may be formed of doped polysilicon or metal.

The first hard mask layer 532 may be formed of an oxide film, and the second hard mask layer 534 may be formed of a polysilicon film. For example, the first hard mask layer 532 may be formed to a thickness of about 1000~3000 Å. The second hard mask layer 534 may be formed to a thickness of about 300~1000 Å.

As illustrated in FIG. 5A, the single mold mask pattern block 540A includes a plurality of mold mask patterns 540. When the single memory cell block 340 desires to form N conductive lines, $\{(N+2)/2\}$ mold mask patterns 540 are included in the mold mask pattern block 540A. For example, when the single memory cell block 340 forms 32 conductive lines as illustrated in FIG. 3, 17 mold mask patterns 540_1-540_17 may be formed as the mold mask patterns 540 that constitute the single mold mask pattern block 540A.

As illustrated in FIG. 5A, the 17 mold mask patterns 540 extend from the memory cell region 300A to the contact region 300B. Each of the mold mask patterns 540 includes a first portion 542 extending in a first direction (i.e., an x direction in FIG. 5A) across the memory cell region 300A and the contact region 300B, and a second portion 544 which is formed only in the contact region 300B and extends in another direction other than the first direction, for example, a second direction (i.e., a y direction in FIG. 5A) perpendicular to the first direction. In the mold mask patterns 540, the second portion 544 extending in a direction (i.e., the x direction in FIG. 5A) perpendicular to the second direction is wider than the first portion 542 extending in a direction (i.e., the y direction in FIG. 5A) perpendicular to the first direction.

When the second hard mask layer 534 is formed of a polysilicon film, the mold mask patterns 540 may be formed of a material having etching selectivity with respect to the second hard mask layer 534, for example, oxide or nitride.

In order to form the mold mask patterns 540, an etching process in which a photoresist pattern (not shown) formed by typical photolithography is used as an etch mask may be used.

Figure 4B:
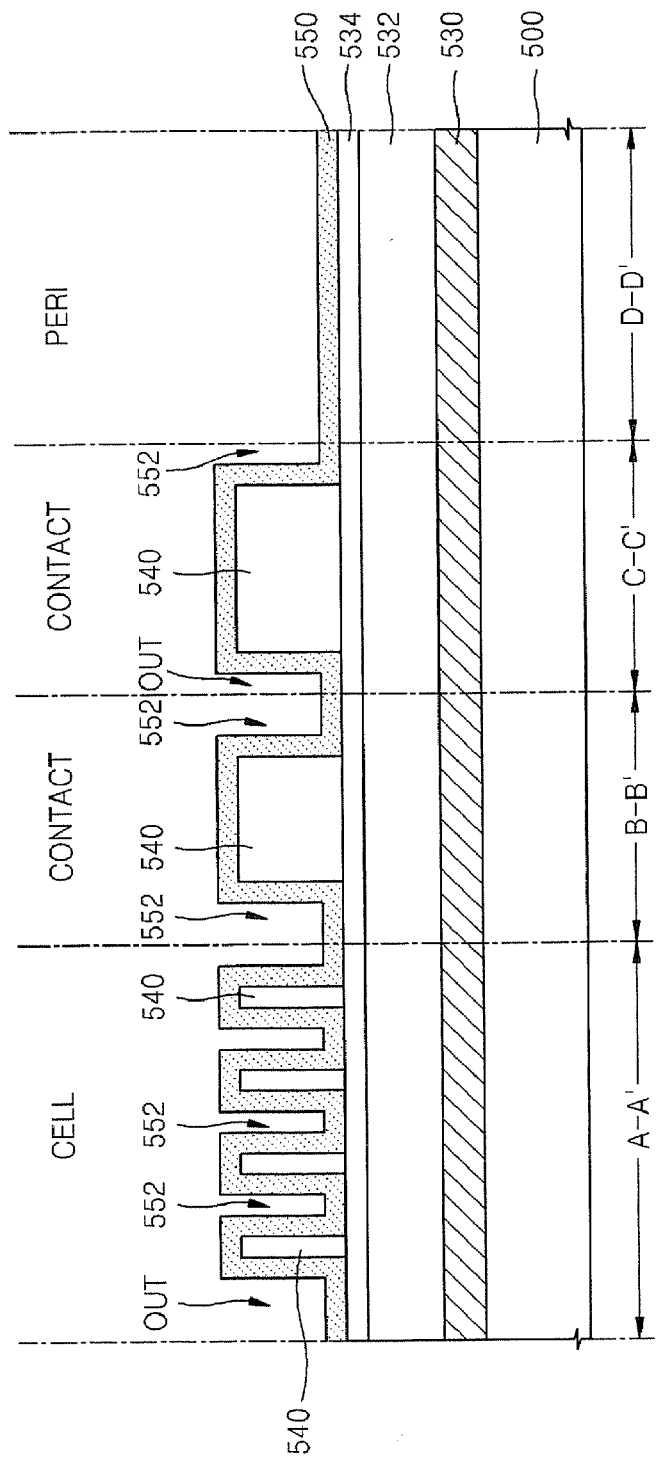

Referring to FIG. 4B, a mask layer 550, covering top surfaces and side walls of the mold mask patterns 540, is formed on the resultant substrate 500 on which the mold mask patterns 540 have been formed.

The mask layer 550 of uniform thickness may be formed to cover the top surfaces and side walls of the mold mask patterns 540. In the memory cell region 300A and the contact region 300B, a plurality of recesses 552 may be formed on an upper surface of the mask layer 550 in between the mold mask patterns 540, within a space defined by two outermost mold mask patterns 540_1 and 540_17 from among the mold mask patterns 540 that constitute the single mold mask pattern block 540A. However, no recesses 552 are formed on the upper surface of the mask layer 550, on the outside OUT of the two outermost mold mask patterns 540_1 and 540_17.

When the second hard mask layer 534 is formed of polysilicon and the mold mask pattern 540 is formed of oxide, the mask layer 550 may be formed of nitride. On the other hand, when the second hard mask layer 534 is formed of polysilicon and the mold mask pattern 540 is formed of nitride, the mask layer 550 may be formed of oxide.

Figure 4C:
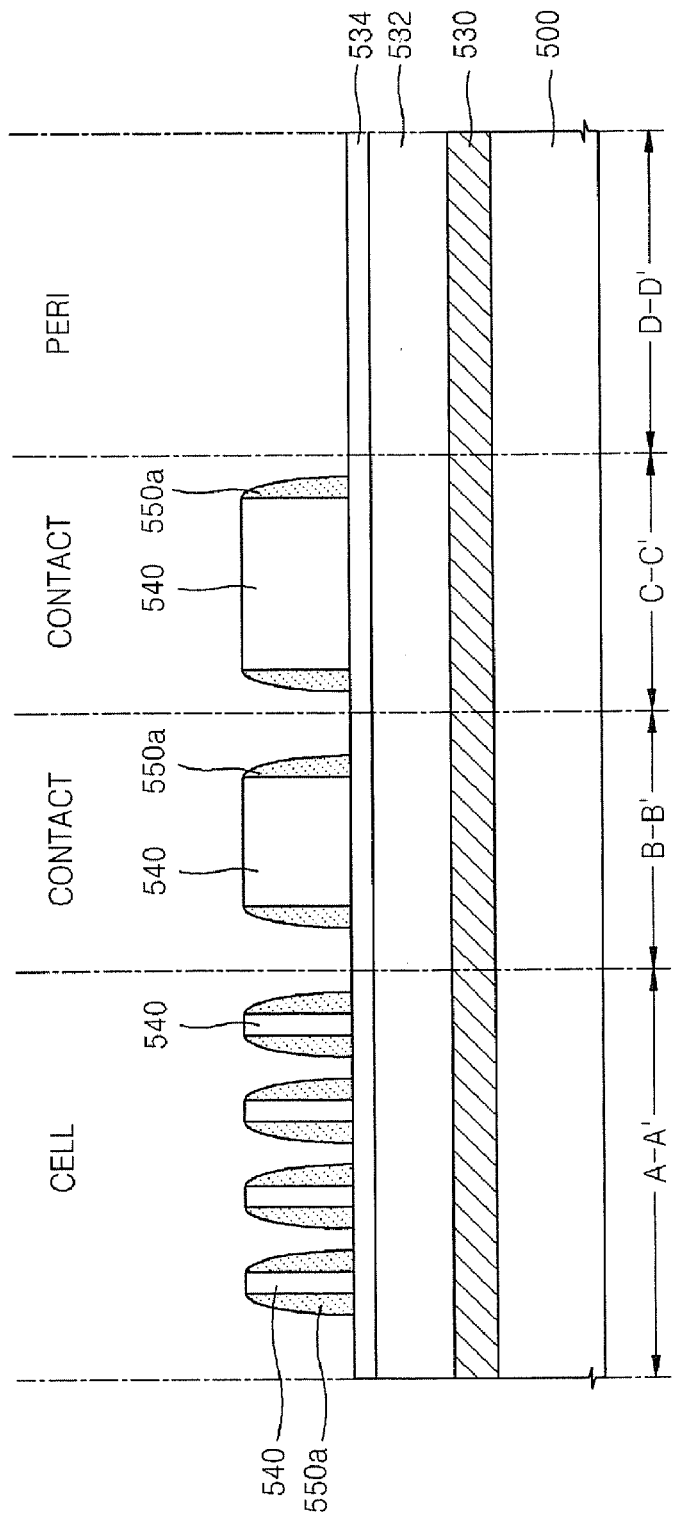
Figure 5B:
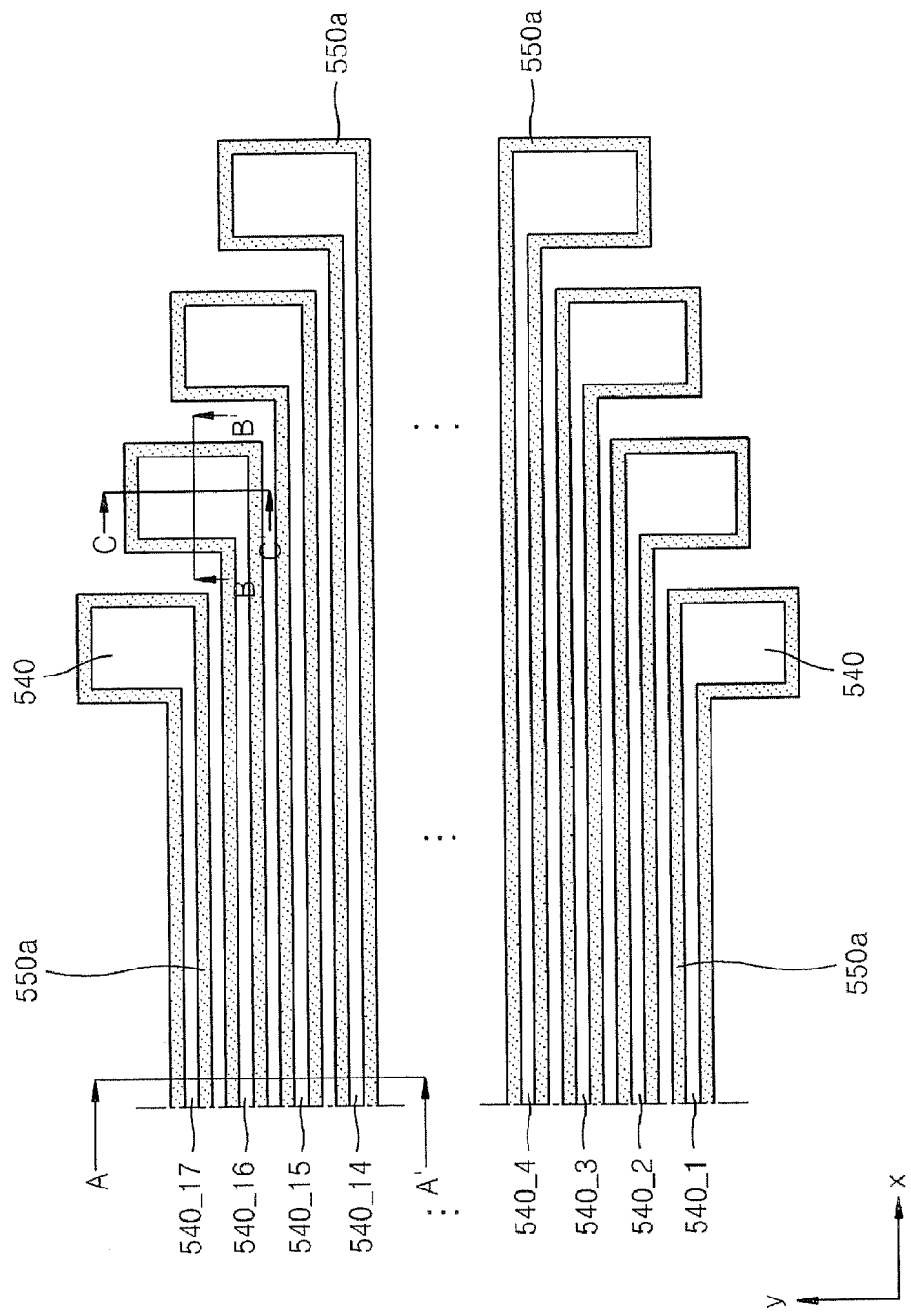

Referring to FIGS. 4C and 5B, a plurality of loop-shaped mask spacers 550a covering sidewalls of the mold mask patterns 540 are formed by etching the mask layer 550.

Consequently, two mask spacers 550a extending along respective sidewalls of two adjacent mold mask patterns 540 and separated from each other exist in between the two adjacent mold mask patterns 540, within the space defined by the two outermost mold mask patterns 540_1 and 540_17 from among the mold mask patterns 540 that constitute the single mold mask pattern block 540A.

Figure 4D:
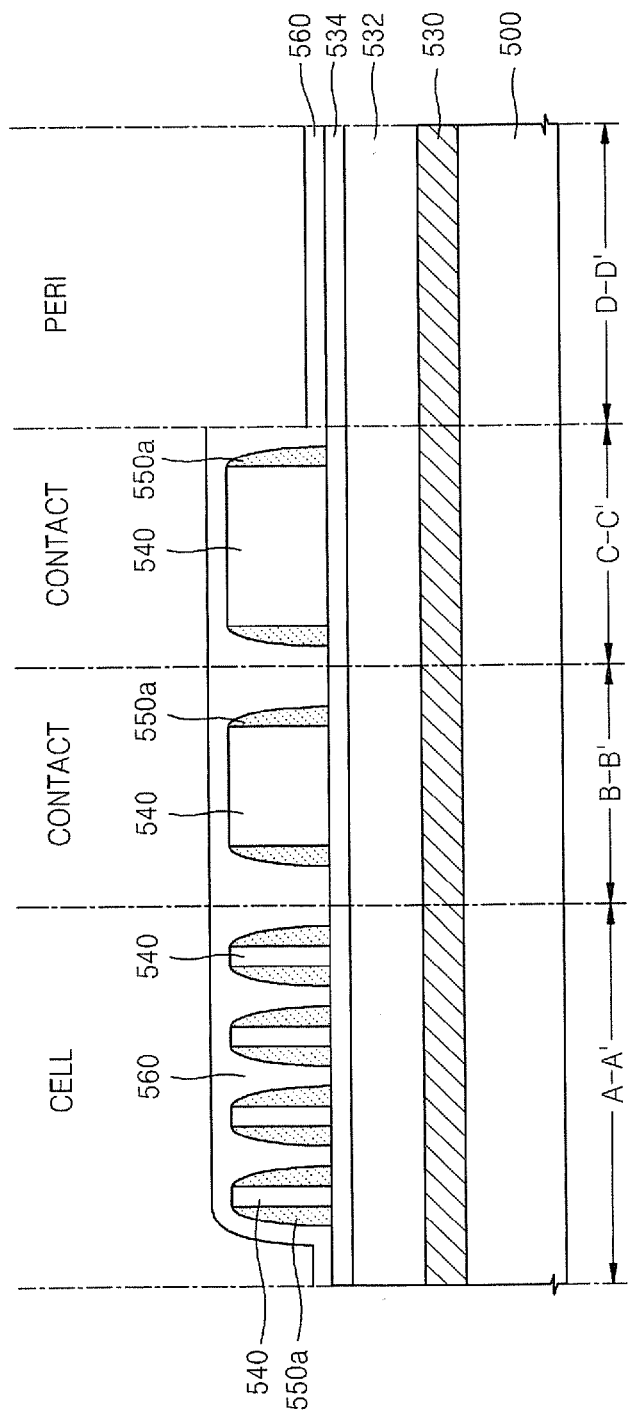

Referring to FIG. 4D, a gap-fill protection film 560 is formed on the resultant substrate 500 on which the mold mask patterns 540 and the mask spacers 550a have been formed. The gap-fill protection film 560 completely covers exposed portions of the mold mask patterns 540, the mask spacers 550a, and the second hard mask layer 534, while also filling gaps between the mask spacers 550a including the recesses 552 illustrated in FIG. 4B.

The gap-fill protection film 560 may be formed of the same material as used to form the mold mask patterns 540. Alternatively, the gap-fill protection film 560 may be formed of a material which is different from that used to form the mold mask patterns 540 but has etching characteristics similar to those of the mold mask patterns 540. When the mask spacers 550a are formed of nitride, the mold mask patterns 540 and the gap-fill protection film 560 may be formed of oxide. On the other hand, when the mask spacers 550a are formed of oxide, the mold mask patterns 540 and the gap-fill protection film 560 may be formed of nitride.

Figure 4E:
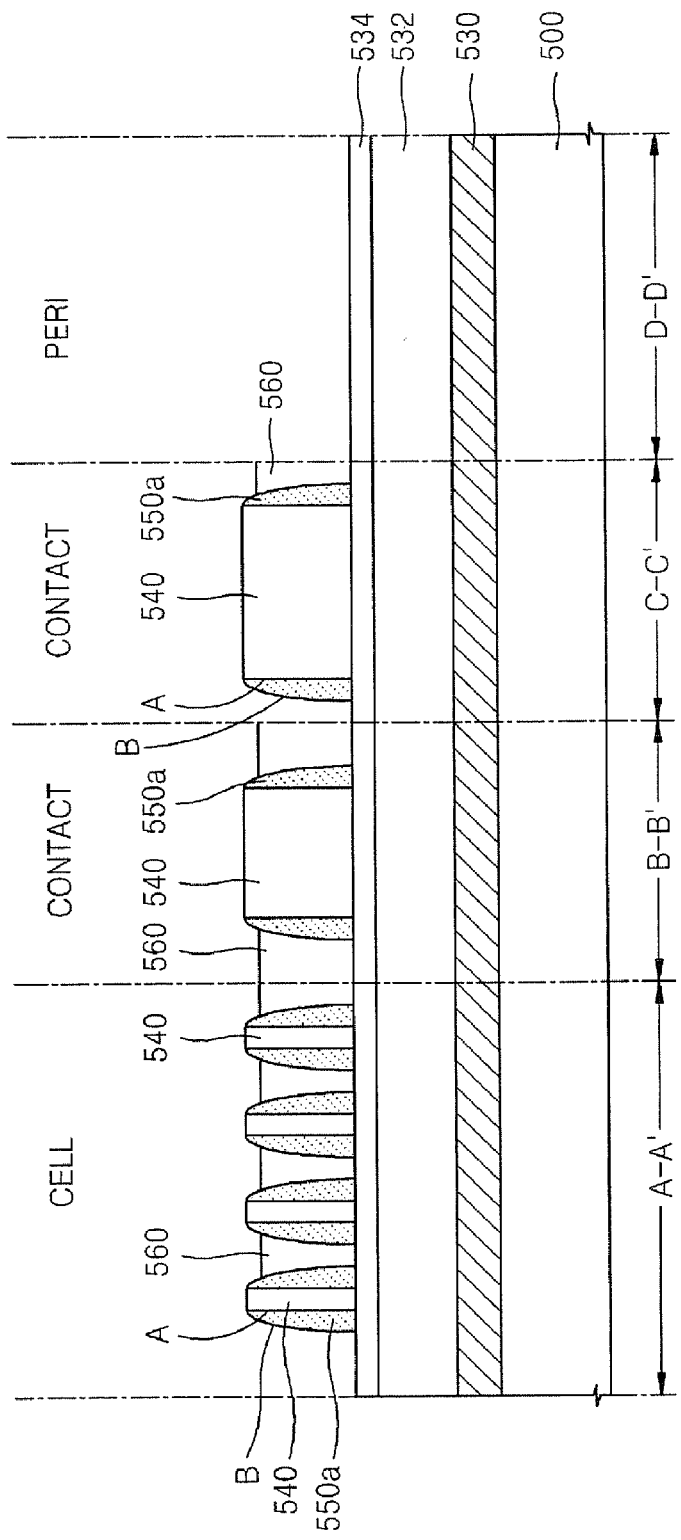
Figure 5C:
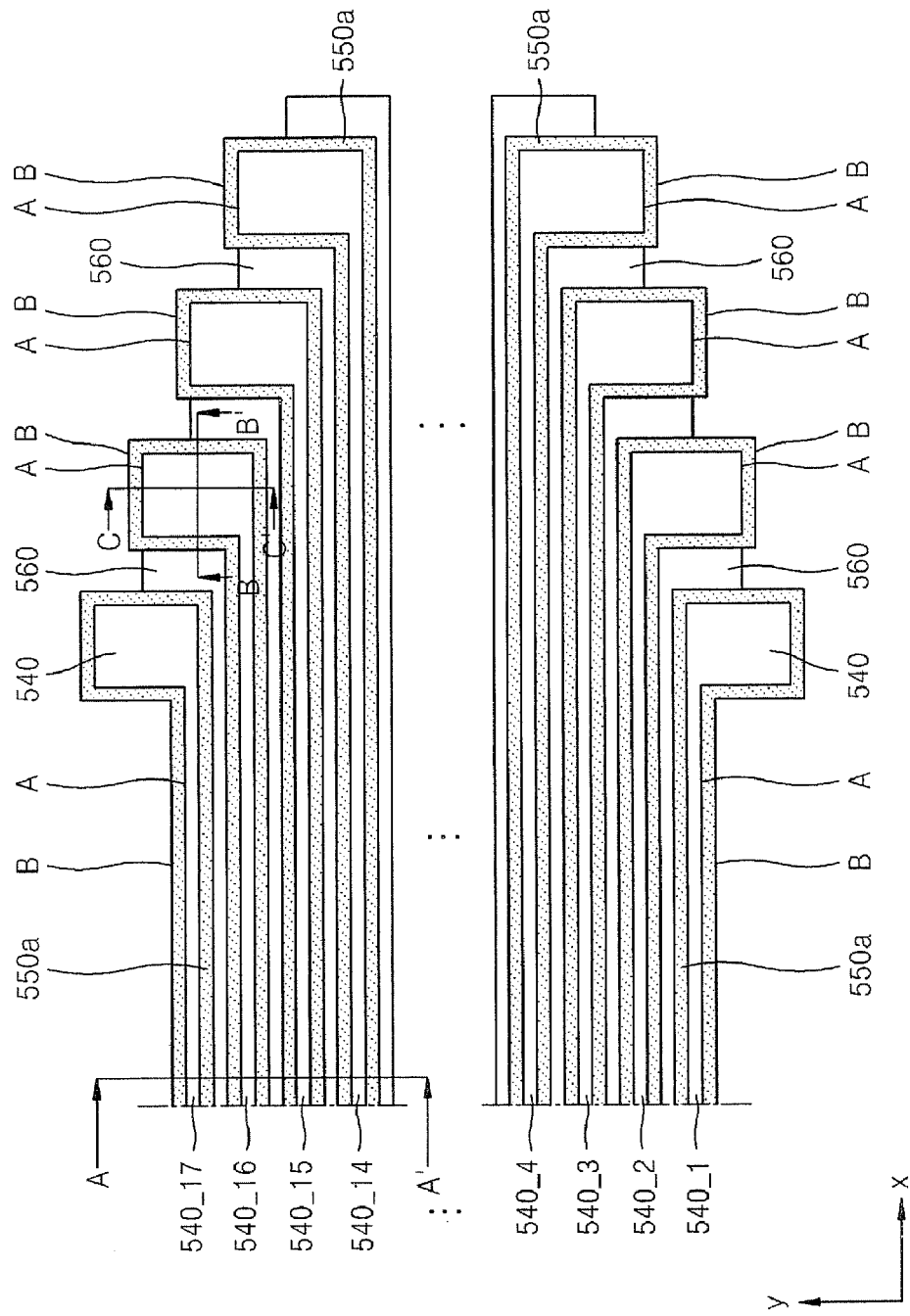

Referring to FIGS. 4E and 5C, outermost portions B of mask spacers 550a that cover portions of the mold mask patterns 540, which provide outermost sidewalls A of the single mold mask pattern block 540A (see FIG. 5A), constituting the single mold mask pattern block 540A are exposed. The single mold mask pattern block 540A is required to form the single memory cell block 340 (see FIG. 3).

In order to expose the outermost portions B, the gap-fill protection film 560 is isotropically etched until the outermost portions B of the mask spacers 550a covering portions of the mold mask patterns 540, which provide the outermost sidewalls A of the single mold mask pattern block 540A, and the upper surfaces of the mold mask patterns 540 constituting the single mold mask pattern block 540A are exposed. The isotropical etching of the gap-fill protection film 560 is performed with the gap-fill protection film 560 completely exposed, and special evaporation or photolithography for forming an etch mask is not performed. The isotropical etching may be wet or dry etching.

Consequently, the gap-fill protection film 560 remains only in gaps between the mask spacers 550a in a space between two adjacent mold mask patterns 540.

Figure 4F:
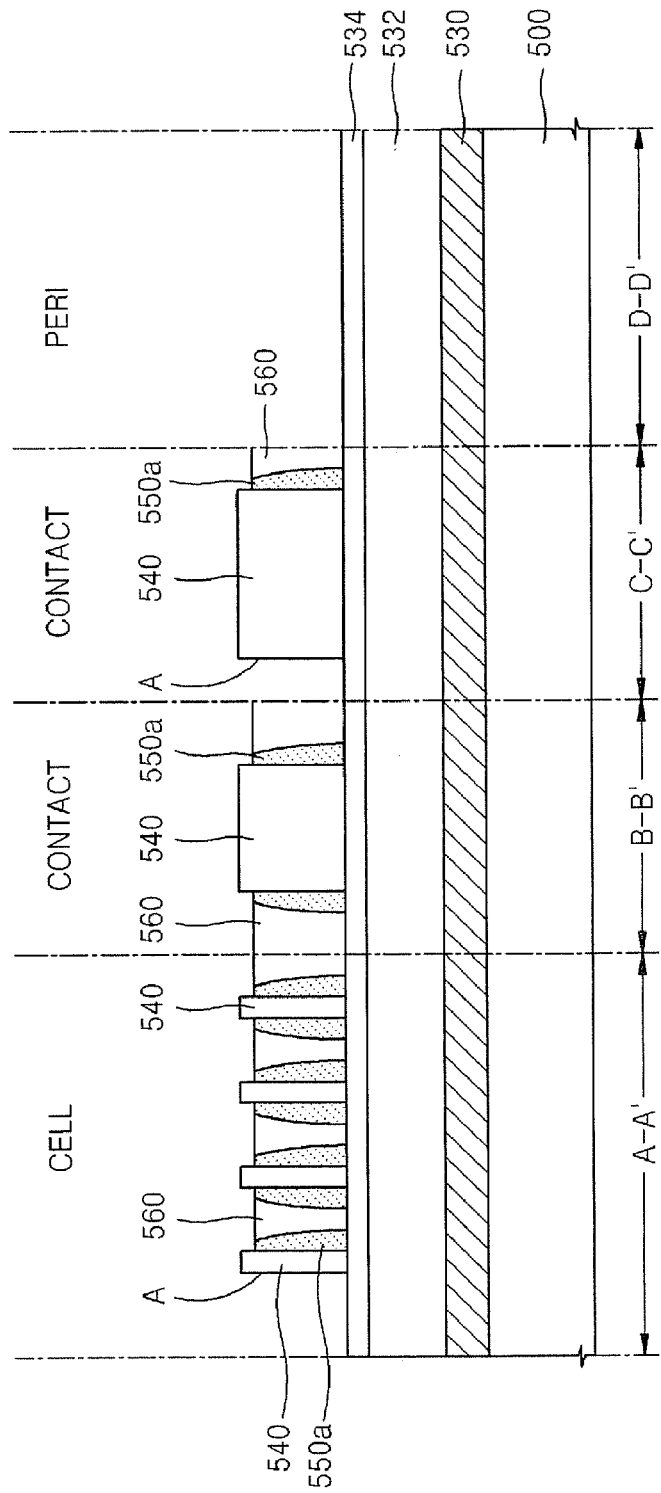
Figure 5D:
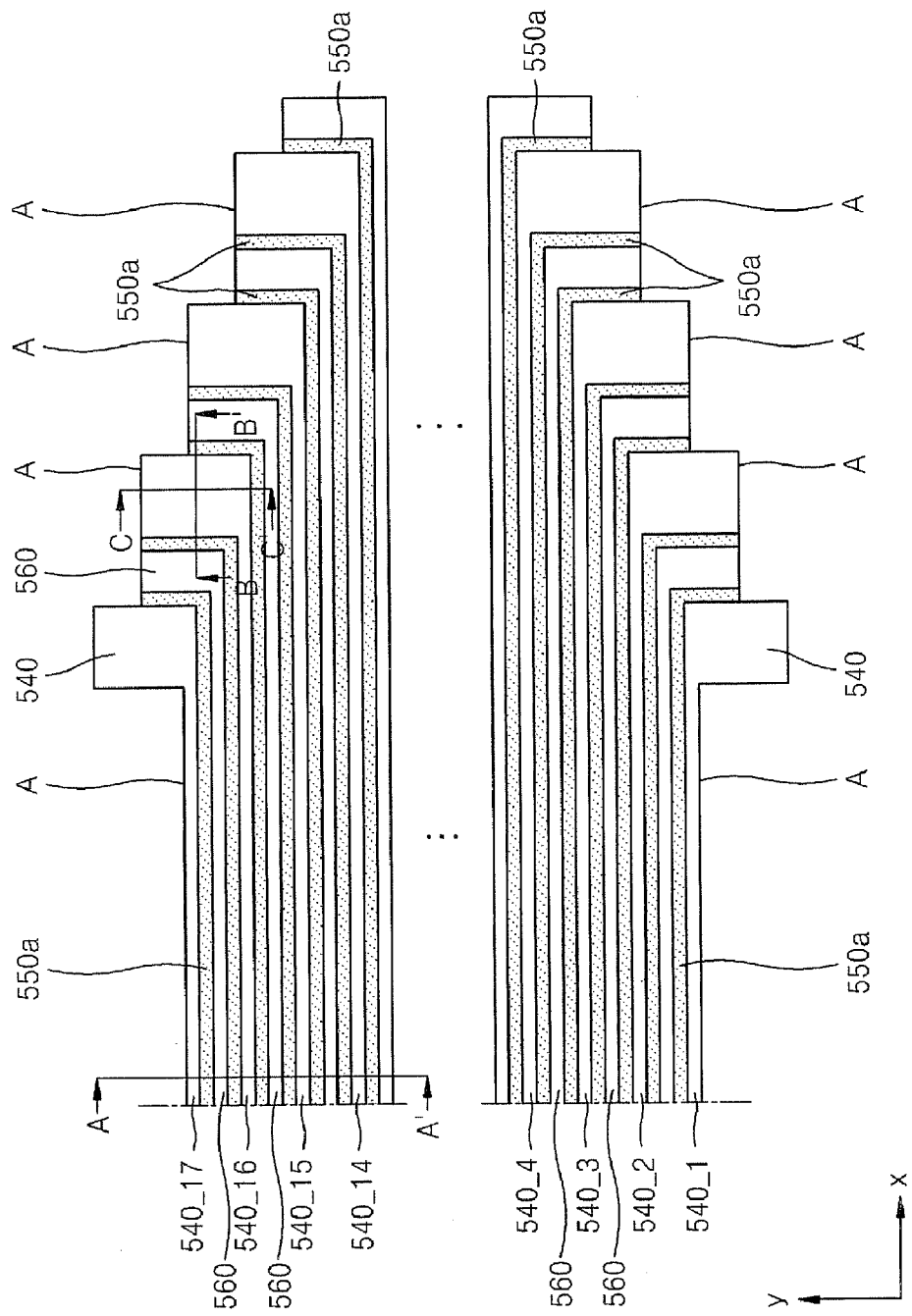

Referring to FIGS. 4F and 5D, the outermost sidewalls A of the single mold mask pattern block 540A (see FIG. 5A), namely, the portions of the mold mask patterns 540 corresponding to the outermost sidewalls A of the single mold mask pattern block 540A, are exposed.

FIG. 5D illustrates that sidewalls of end portions of the mold mask patterns 540, which are located in the contact region 300B, are exposed. Although not shown in FIG. 5D, sidewalls of end portions of the mold mask patterns 540, which are located in the memory cell region 300A, are also exposed as a result of the isotropical etching.

In order to expose the outermost sidewalls A, exposed portions of the mask spacers 550a are isotropically etched. At this time, special photolithography for forming an etch mask is not performed. The isotropical etching may be wet or dry etching. As a result of the isotropical etching, portions of the sidewalls of the mold mask patterns 540, not facing other mold patterns 540, are exposed.

Since the outermost sidewalls A of the mold mask patterns 540 are exposed by etching the exposed portions of the mask spacers 550a, a single mask spacer 550a surrounding a single mold mask pattern 540 within the mold mask pattern block 540A is halved. Consequently, an effect whereby unnecessary portions of the mask spacers 550a are trimmed around contact pads for peripheral circuit connections within the contact region 300B (see FIG. 3) is obtained.

Figure 4G:
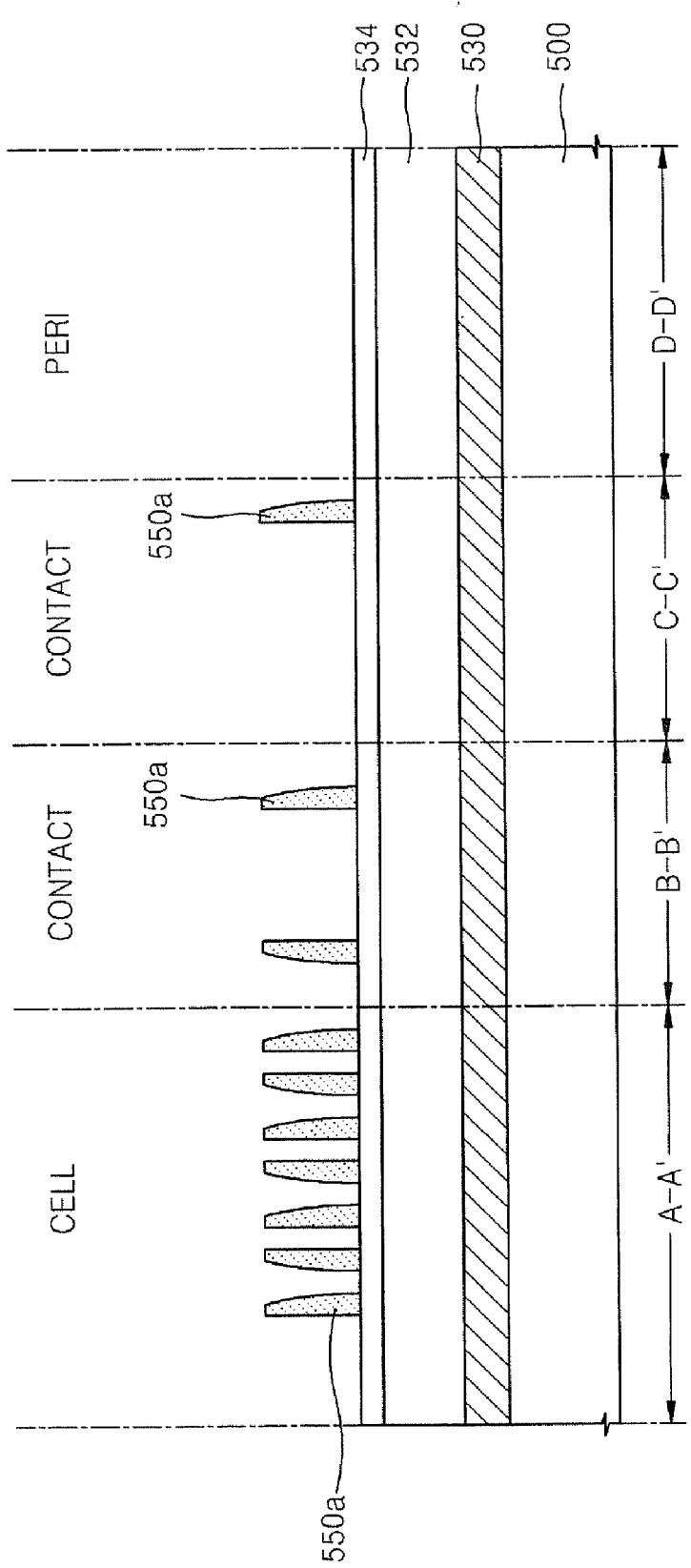
Figure 5E:
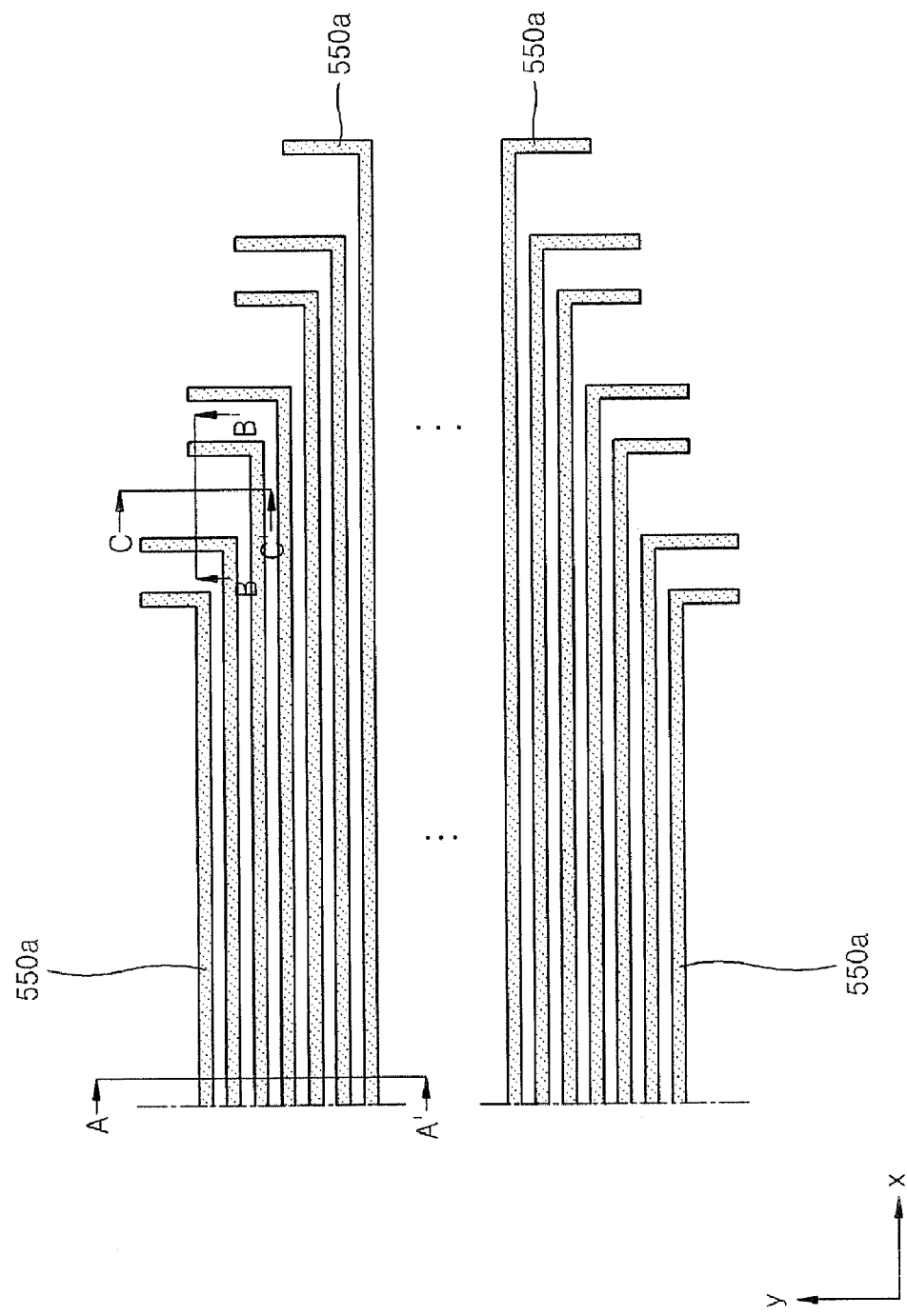

Referring to FIGS. 4G and 5E, under a condition that etching of the second hard mask layer 534 and the mask spacers 550a is suppressed, the mold mask patterns 540 and the gap-fill protection film 560 are etched back so as to be completely removed. In order to remove the mold mask patterns 540 and the gap-fill protection film 560, a dry or wet etchback process may be used.

Figure 4H:
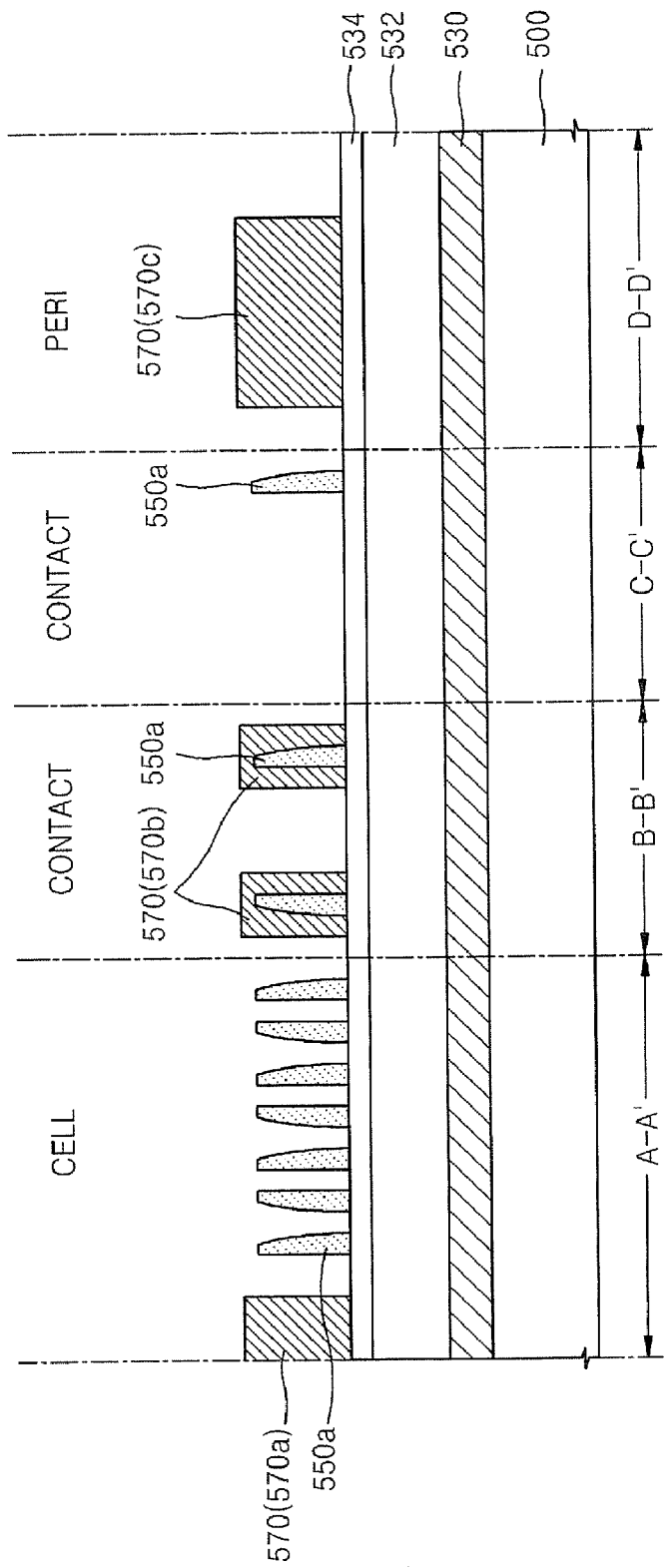

Referring to FIGS. 4H and 5F, local mask patterns 570 are formed within the memory cell region 300A, the contact region 300B, and the peripheral circuit region 300C.

The local mask patterns 570 include a plurality of first local mask patterns 570a for forming a plurality of string selection lines SSL and a plurality of ground selection lines GSL within the memory cell region 300A, a plurality of second local mask patterns 570b for forming the contact pads 352 within the contact region 300B, and a plurality of third local mask patterns 570c (not shown in FIG. 5F) for forming unit elements required to constitute a peripheral circuit, for example, the conductive patterns 372 for peripheral circuits of FIG. 3, within the peripheral circuit region 300C. Although not shown in the drawings, the local mask patterns 570 may further include a fourth local mask pattern (not shown) for forming a photomask alignment key on the substrate 500. In some cases, the fourth local mask pattern may be formed at a desired location on the substrate 500, for example, in the contact region 300B, the peripheral circuit region 300C, or other locations. In some cases, the local mask patterns 570 may be formed on areas having no mask spacer 550a formed thereon, in the memory cell region 300A and the peripheral circuit region 300C. Alternatively, the local mask patterns 570 may be formed on the mask spacers 550a within the contact region 300B.

The local mask patterns 570 may be photoresist patterns formed by typical photolithography. Alternatively, each of the local mask patterns 570 may be a stack of a carbon-contained film pattern, an SiON pattern, and a photoresist pattern. A case where the local mask patterns 570 are stack structures will be described later in greater detail with reference to FIG. 8H, in which a process of forming local mask patterns 870 is illustrated.

Figure 4I:
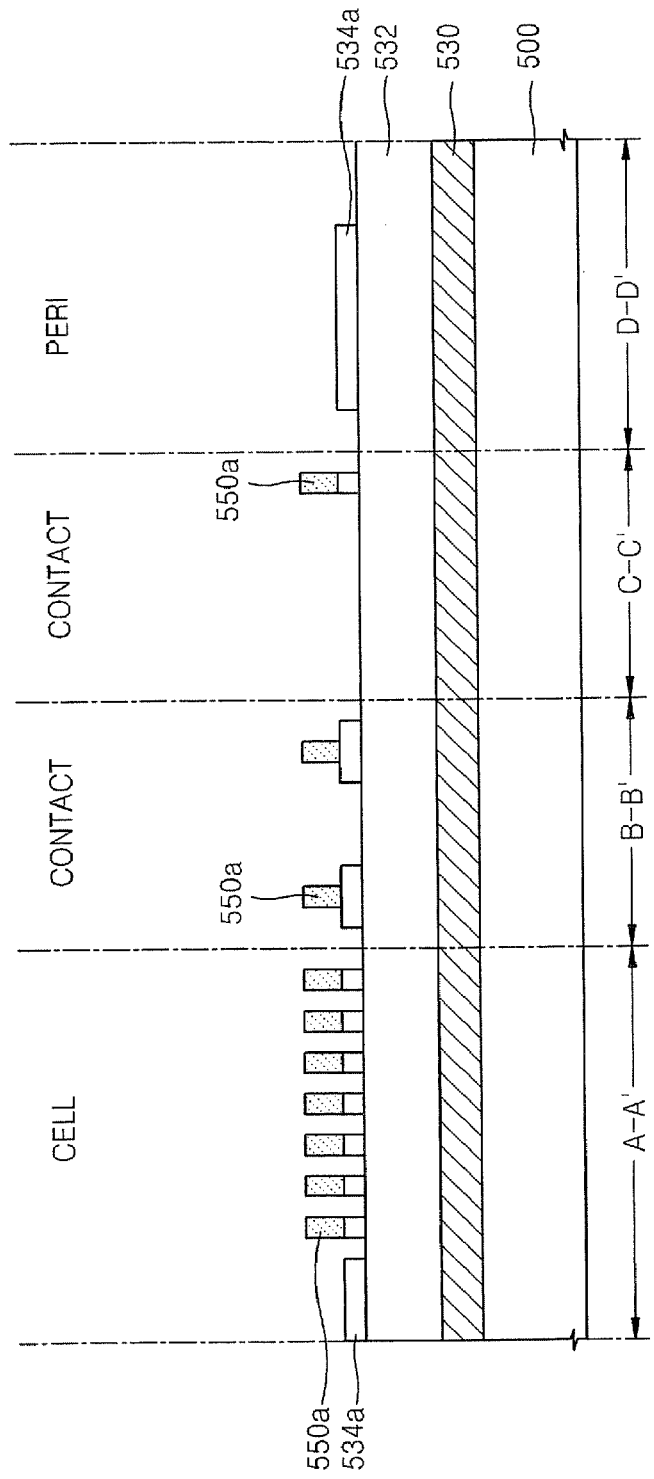

Referring to FIG. 4I, in the memory cell region 300A, the contact region 300B, and the peripheral circuit region 300C on the substrate 500, the second hard mask layer 534 is etched using the mask spacers 550a and the local mask patterns 570 as an etch mask, thereby forming second hard mask patterns 534a.

As illustrated in FIG. 4I, the local mask patterns 570 may be completely removed from the substrate 500 during the etching process for forming the second hard mask patterns 534a. However, the local mask patterns 570 may not be completely removed from the substrate 500, and in this state a subsequent process may be performed.

Figure 4J:
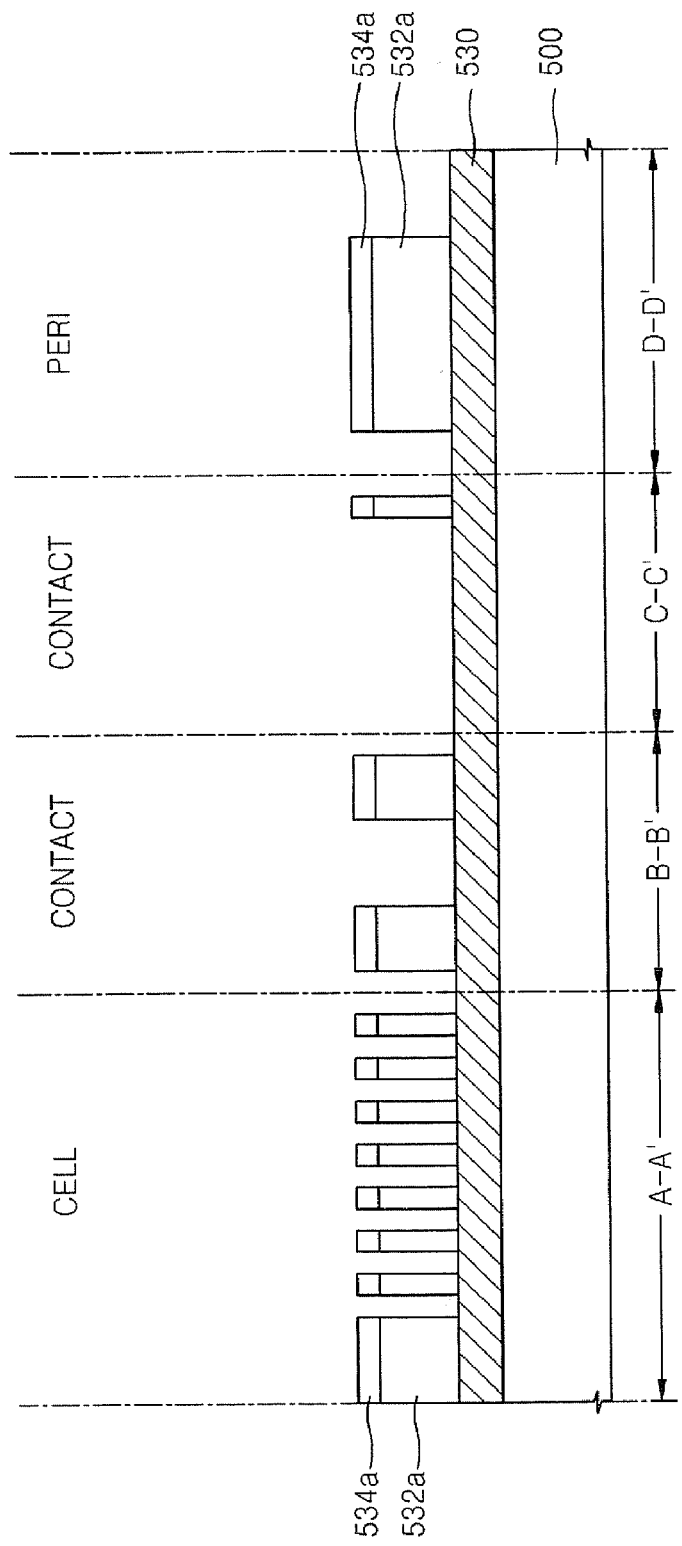

Referring to FIG. 4J, in the memory cell region 300A, the contact region 300B, and the peripheral circuit region 300C on the substrate 500, the first hard mask layer 532 is etched using the second hard mask patterns 534a as an etch mask, thereby forming first hard mask patterns 532a.

Figure 4K:
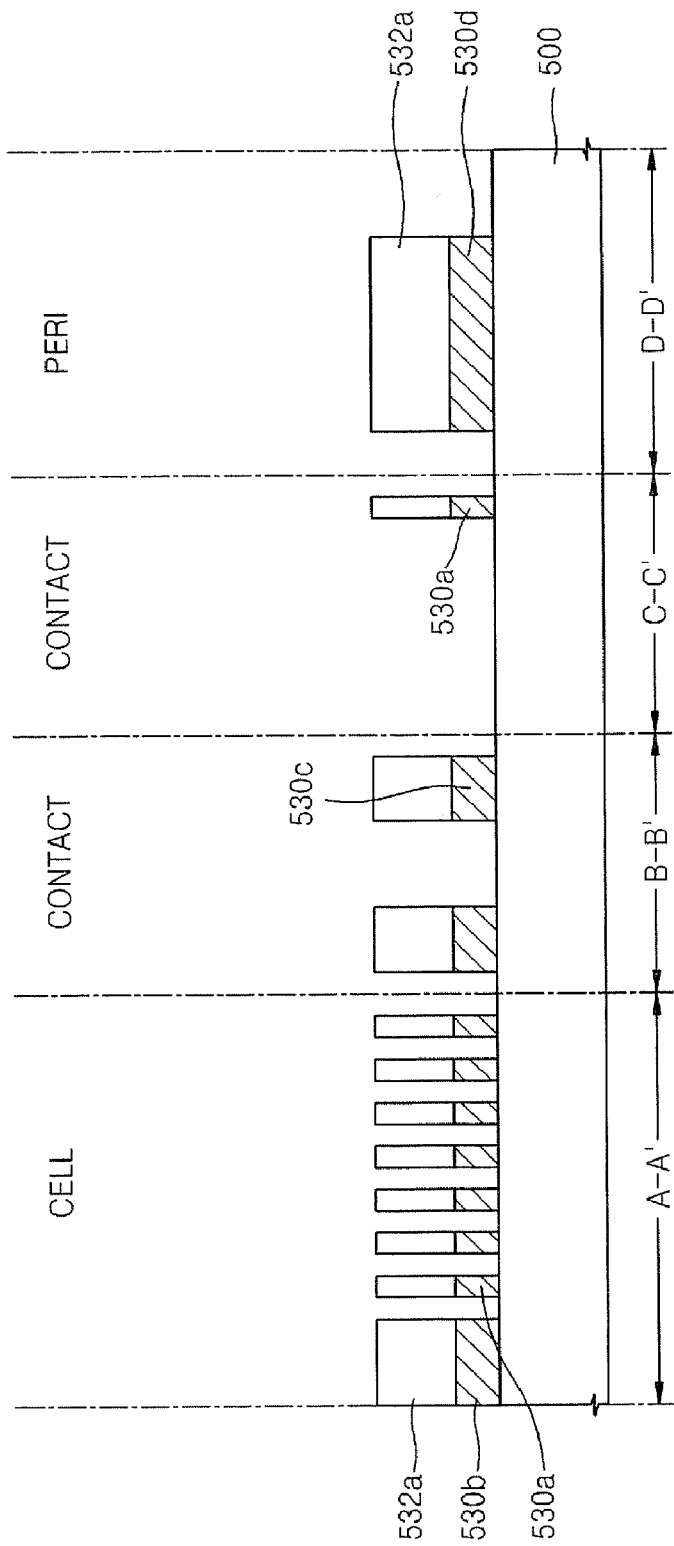

Referring to FIG. 4K, in the memory cell region 300A, the contact region 300B, and the peripheral circuit region 300C on the substrate 500, the conductive layer 530 is etched using the first hard mask patterns 532a as an etch mask, thereby forming a plurality of first conductive lines 530a for forming a cell array and a plurality of second conductive lines 530b for forming a string selection line SSL and a ground selection line GSL on the substrate 500 within the memory cell region 300A. Simultaneously with the formations of the first and second conductive lines 530a and 530b, a plurality of contact pads 530c integrally connected with the first conductive lines 530a are formed in the contact region 300B, and conductive patterns 530d for peripheral circuits are formed in the peripheral circuit region 300C.

The first conductive lines 530a formed within the memory cell region 300A may correspond to the conductive lines 301, 302, through to 332 illustrated in FIG. 3, and the second conductive lines 530b formed within the memory cell region 300A may correspond to the string selection line SSL and the ground selection line GSL illustrated in FIG. 3. The contact pads 530c, which are integrally connected with the first conductive lines 530a, formed within the contact region 300B may correspond to the contact pads 352 illustrated in FIG. 3. The conductive patterns 530d for peripheral circuits formed in the peripheral circuit region 300C may correspond to the conductive patterns 372 for peripheral circuits illustrated in FIG. 3.

FIGS. 6A through 6F are cross-sectional views for explaining a method of forming fine patterns of the semiconductor device of FIG. 3, according to a second embodiment of the present invention.

In FIGS. 6A through 6F, the same reference characters as those of FIGS. 3, 4A through 4K, and 5A through 5F denote like elements, and thus their description will be omitted.

Figure 6A:
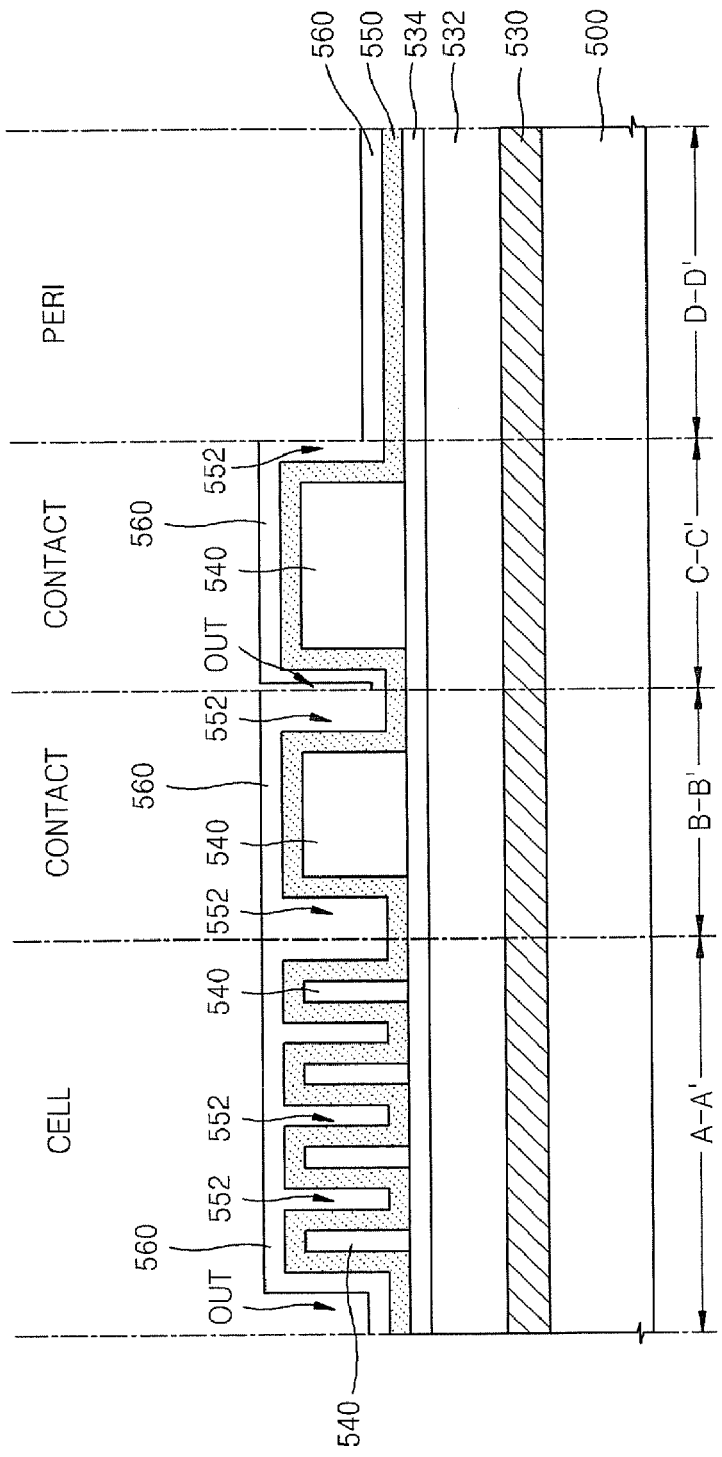

Referring to FIG. 6A, in a method as described above with reference to FIGS. 4A, 5A, and 4B, the conductive layer 530, the first hard mask layer 532, and the second hard mask layer 534 are sequentially formed on the substrate 500, and the mold mask patterns 540 and the mask layer 550 are then formed on the second hard mask layer 534.

Thereafter, the gap-fill protection film 560 is formed on the mask layer 550.

The gap-fill protection film 560 may be formed according to a process similar to that described above with reference to FIG. 4D. In other words, the gap-fill protection film 560 may be formed to completely cover the mask layer 550 while filling the recesses 552 formed on the upper surface of the mask layer 550 between two adjacent mold mask patterns 540.

Figure 6B:
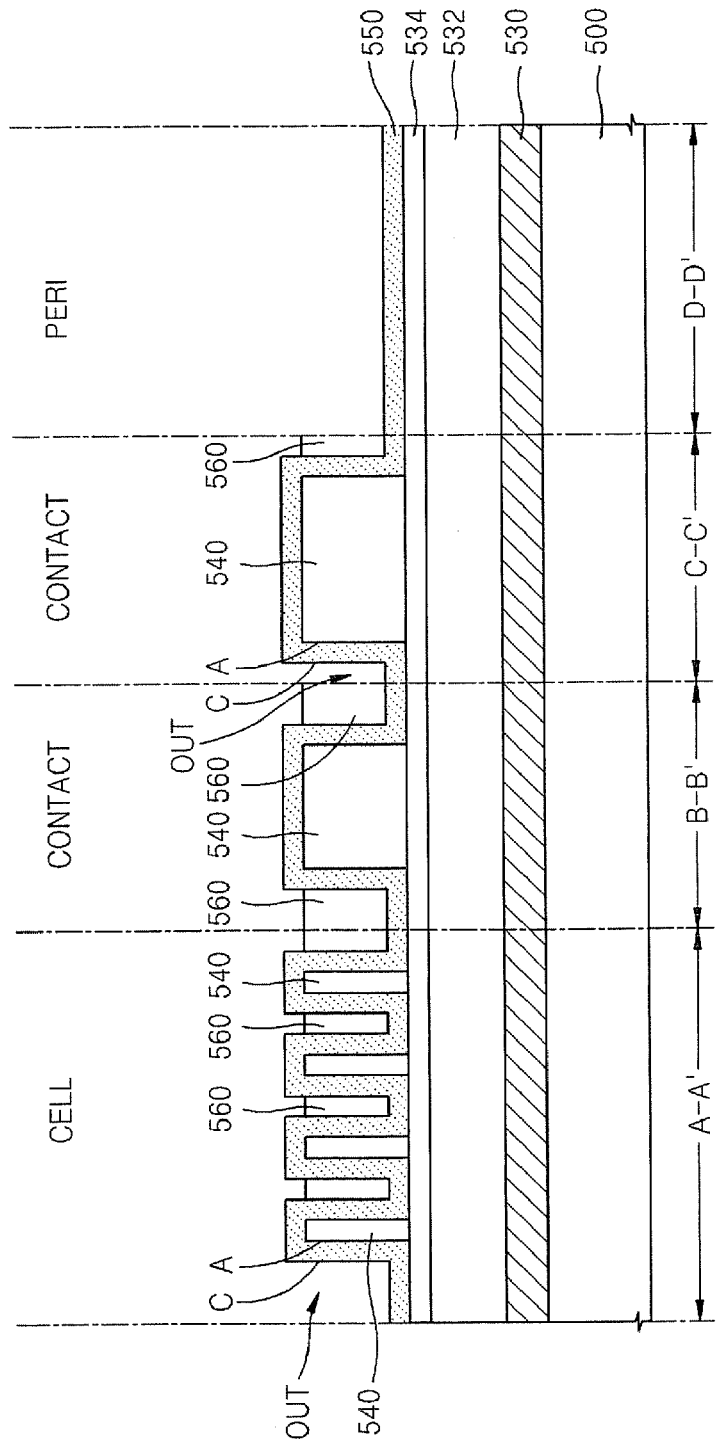

Referring to FIG. 6B, in a method similar to that described above with reference to FIGS. 4E and 5C, outermost portions C of the mask layer 550 that cover the portions of the mold mask patterns 540, which provide the outermost sidewalls A of the single mold mask pattern block 540A, constituting the single mold mask pattern block 540A are exposed. The single mold mask pattern block 540A is required to form the single memory cell block 340 (see FIG. 3).

In order to expose the outermost portions C of the mask layer 550, the gap-fill protection film 560 is isotropically etched until the outermost portions C of the mask layer 550 covering portions of the mold mask patterns 540, which provide the outermost sidewalls A of the single mold mask pattern block 540A, and the upper surfaces of the mold mask patterns 540 constituting the single mold mask pattern block 540A are exposed. The isotropical etching may be wet or dry etching.

Consequently, the gap-fill protection film 560 remains only in the recesses 552 between two adjacent mold mask patterns 540.

Figure 6C:
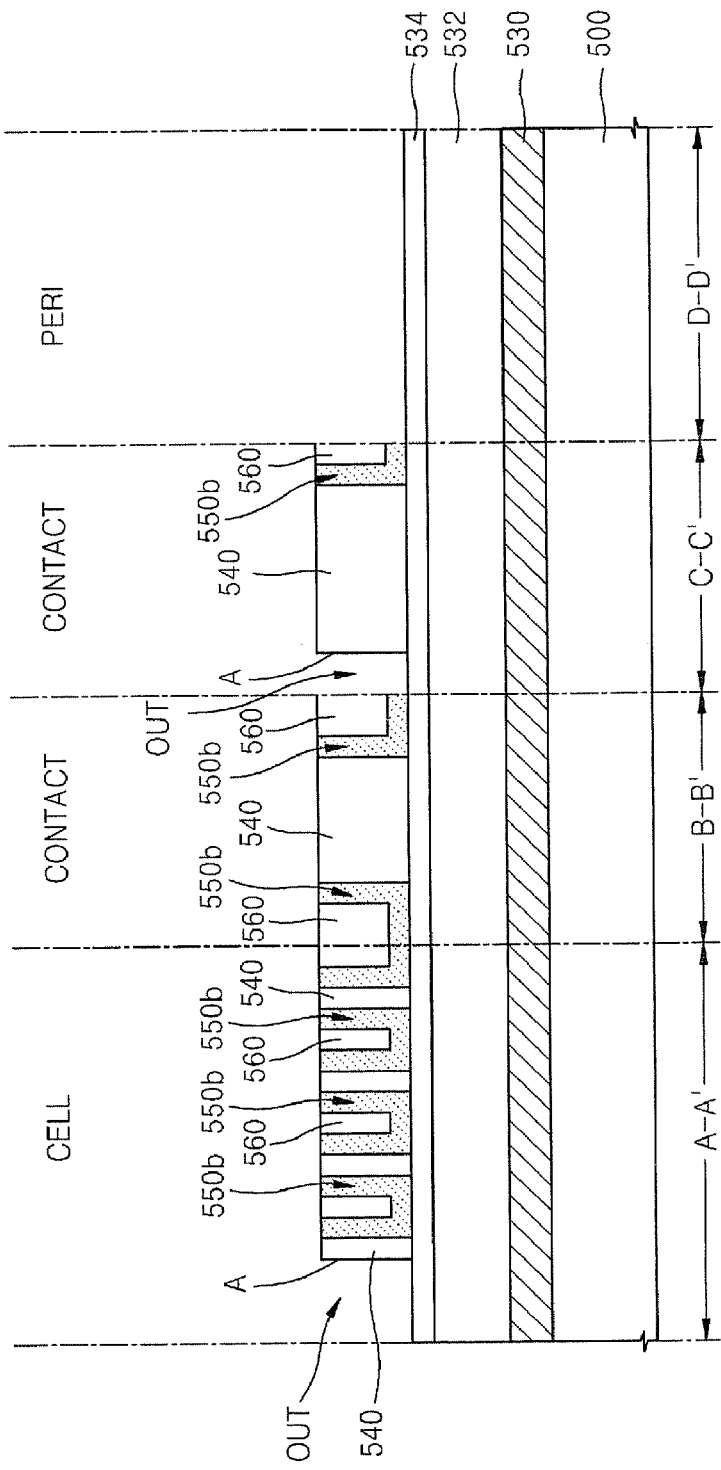

Referring to FIG. 6C, in a method similar to that described above with reference to FIGS. 4F and 5D, the outermost sidewalls A of the single mold mask pattern block 540A, namely, the portions of the mold mask patterns 540 corresponding to the outermost sidewalls A of the single mold mask pattern block 540A, are exposed.

In order to expose the outermost sidewalls A, an exposed portion of the mask layer 550 is isotropically etched. The isotropical etching may be wet or dry etching.

Since the outermost sidewalls A of the mold mask patterns 540 are exposed by etching the exposed portion of the mask layer 550, the mask layer 550 surrounding a single mold mask pattern 540 within the mold mask pattern block 540A is cut away at the outermost sidewalls A. Consequently, an effect whereby an unnecessary portion of the mask layer 550 is trimmed around contact pads for peripheral circuit connections within the contact region 300B (see FIG. 3) is obtained.

After the outermost sidewalls A of the mold mask patterns 540 are exposed, a plurality of butted mask pattern pairs 550b having cross-sections that are roughly "U" shaped are formed between adjacent two mold mask patterns 540 by portions of the mask layer 550 remaining within the mold mask pattern block 540A. Each of the butted mask pattern pairs 550b includes two vertical extensions 550v (see FIG. 6D) covering respective sidewalls of two adjacent mold mask patterns 540 of the mold mask pattern block 540A, and a horizontal extension 550h (see FIG. 6D) connecting the two vertical extensions 550v to each other.

Referring to FIG. 6D, in a method similar to that described above with reference to FIGS. 4G and 5E, under a condition that etching of the second hard mask layer 534 and the butted mask pattern pairs 550b is suppressed, the mold mask patterns 540 and the gap-fill protection film 560 are etched back so as to be completely removed. In order to remove the mold mask patterns 540 and the gap-fill protection film 560, a dry or wet etchback process may be used.

Consequently, only the butted mask pattern pairs 550b remain on the second hard mask layer 534.

Figure 6E:
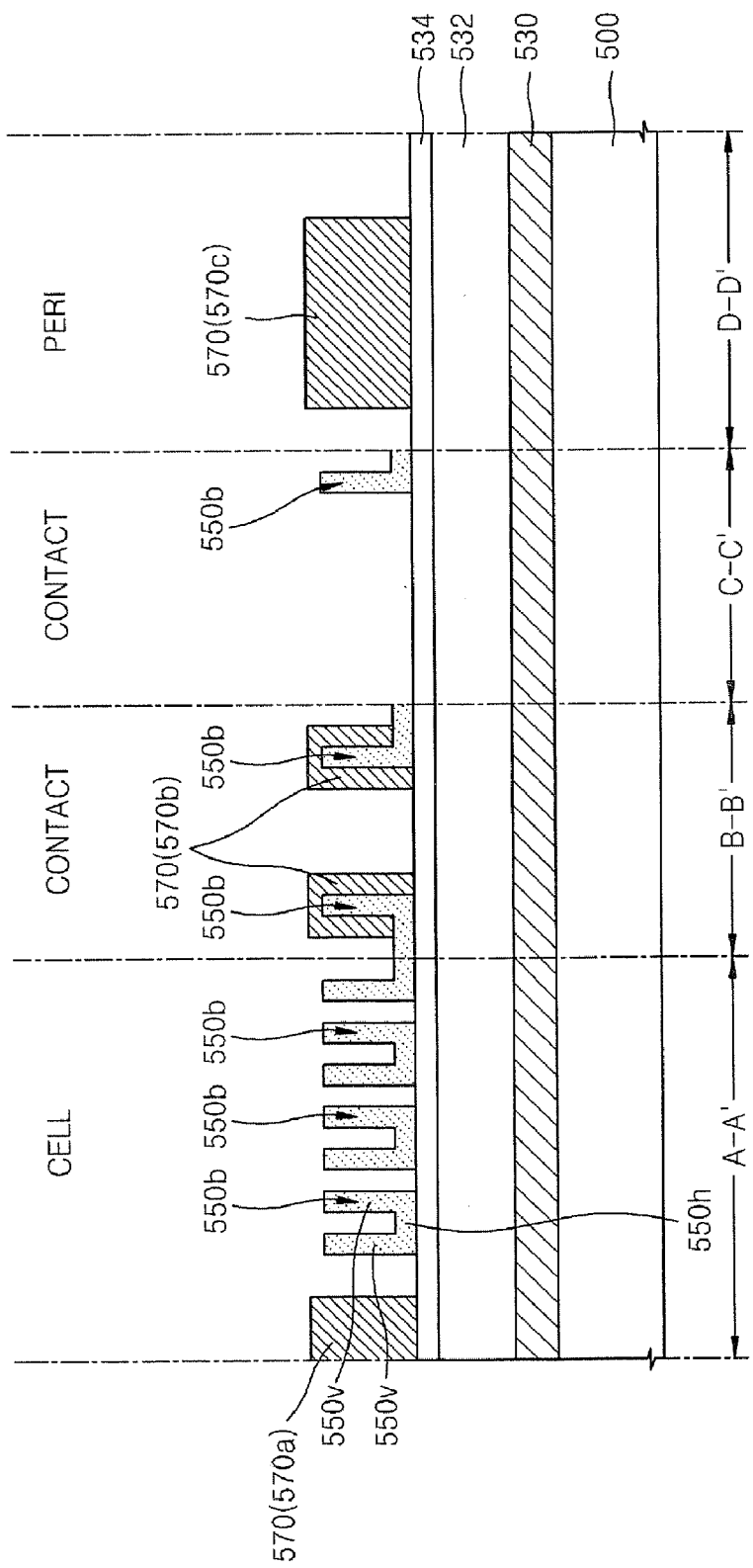

Referring to FIG. 6E, in a method similar to that described above with reference to FIGS. 4H and 5F, the local mask patterns 570 are formed within the memory cell region 300A, the contact region 300B, and the peripheral circuit region 300C.

The local mask patterns 570 include a plurality of first local mask patterns 570a for forming a plurality of string selection lines SSL and a plurality of ground selection lines GSL within the memory cell region 300A, a plurality of second local mask patterns 570b for forming the contact pads 352 within the contact region 300B, and a plurality of third local mask patterns 570c (not shown in FIG. 5F) for forming unit elements required to constitute a peripheral circuit, for example, the conductive patterns 372 for peripheral circuits of FIG. 3, within the peripheral circuit region 300C.

Figure 6F:
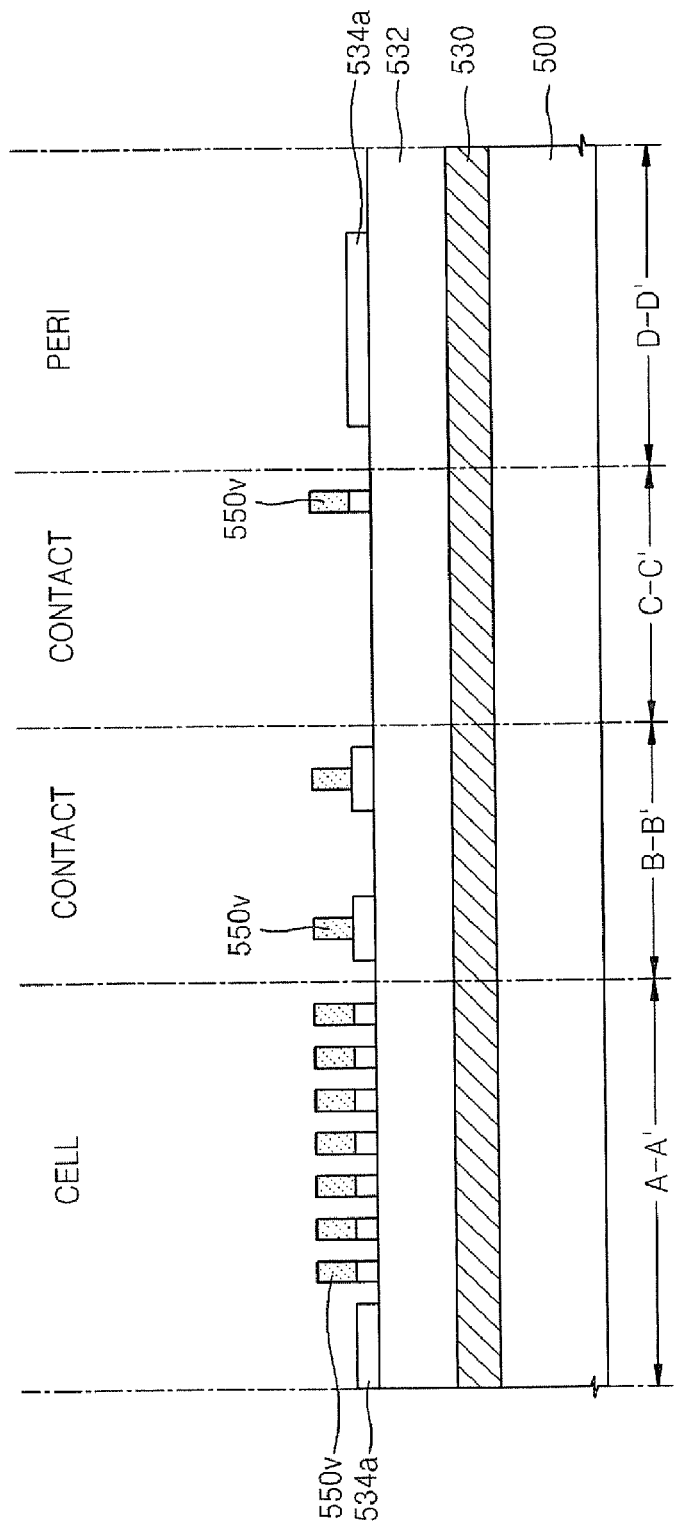

Referring to FIG. 6F, in a method similar to that described above with reference to FIG. 4I, in the memory cell region 300A, the contact region 300B, and the peripheral circuit region 300C on the substrate 500, the second hard mask layer 534 is etched using the butted mask pattern pairs 550b and the local mask patterns 570 as an etch mask. However, in the present embodiment, while the second hard mask layer 534 is being etched using the butted mask pattern pairs 550b and the local mask patterns 570 as an etch mask, portions of the vertical extensions 550v of the butted mask pattern pairs 550b are consumed, starting from the upper surfaces thereof, and the horizontal extensions 550h of the butted mask pattern pairs 550b are also consumed in proportion to the amount of consumption of the vertical extensions 550v. Consequently, a portion of the second hard mask layer 534 between the two vertical extensions 550v of each of the butted mask pattern pairs 550b is exposed. Thus, the second hard mask layer 534 is etched using the vertical extensions 550v of the butted mask pattern pairs 550b and the local mask patterns 570 as an etch mask, thereby forming second hard mask patterns 534a having a structure as illustrated in FIG. 4I.

Similar to FIG. 4I, the local mask patterns 570 may be completely removed from the substrate 500 during the etching process for forming the second hard mask patterns 534a. However, the local mask patterns 570 may not be completely removed from the second hard mask patterns 534a, and in this state a subsequent process may be performed.

Thereafter, in a method similar to that described above with reference to FIGS. 4J and 4K, in the memory cell region 300A, the contact region 300B, and the peripheral circuit region 300C on the substrate 500, the first hard mask layer 532 is etched using the second hard mask patterns 534a as an etch mask, thereby forming first hard mask patterns 532a. Also, in the memory cell region 300A, the contact region 300B, and the peripheral circuit region 300C on the substrate 500, the conductive layer 530 is etched using the first hard mask patterns 532a as an etch mask, thereby forming a plurality of first conductive lines 530a for forming a cell array and a plurality of second conductive lines 530b for forming a string selection line SSL and a ground selection line GSL on the substrate 500 within the memory cell region 300A. Simultaneously with the formations of the first and second conductive lines 530a and 530b, a plurality of contact pads 530c integrally connected with the first conductive lines 530a are formed in the contact region 300B, and conductive patterns 530d for peripheral circuits are formed in the peripheral circuit region 300C.

Figure 7A:
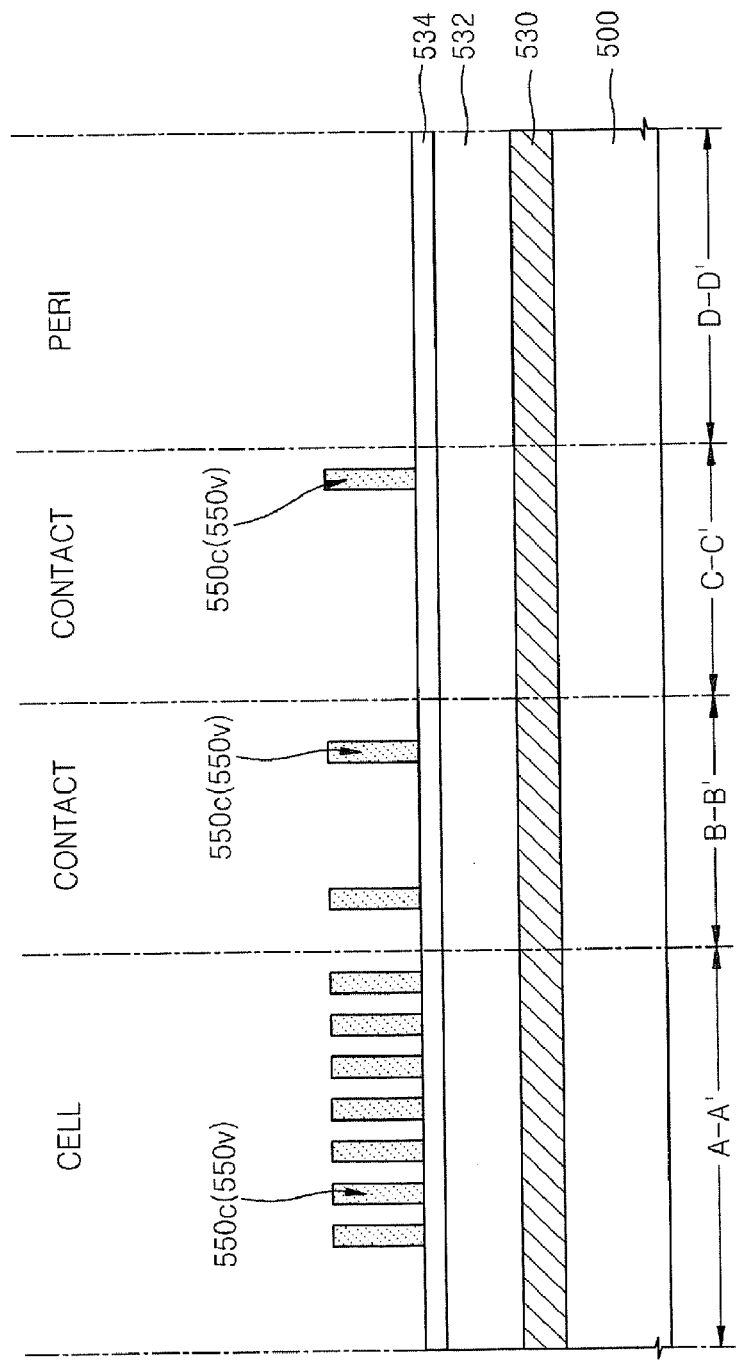
FIGS. 7A and 7B are cross-sectional views for explaining a method of forming fine patterns of the semiconductor device of FIG. 3, according to a third embodiment of the present invention.
Figure 7B:
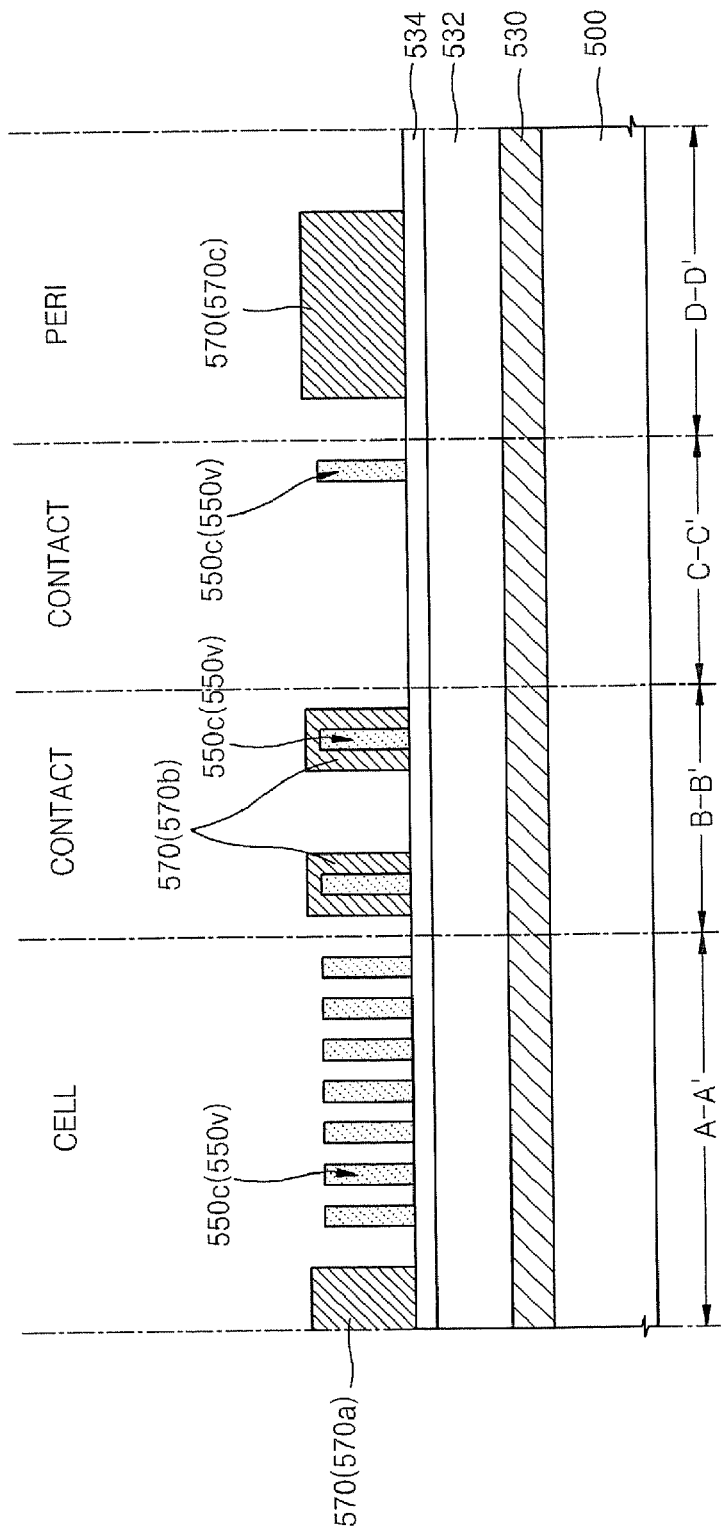

FIGS. 7A and 7B are cross-sectional views for explaining a method of forming fine patterns of the semiconductor device of FIG. 3, according to a third embodiment of the present invention.

In FIGS. 7A and 7B, the same reference characters as those of FIGS. 3, 4A through 4K, 5A through 5F, and 6A through 6F denote like elements, and thus their description will be omitted.

Referring to FIG. 7A, in a method similar to that described above with reference to FIGS. 6A through 6D, the conductive layer 530, the first hard mask layer 532, and the second hard mask layer 534 are sequentially formed on the substrate 500, and a plurality of butted mask pattern pairs 550b are then formed on the second hard mask layer 534.

Thereafter, the butted mask pattern pairs 550b are entirely etched back until the horizontal extensions 550h of the butted mask pattern pairs 550b are completely removed. Thus, portions of the upper surface of the second hard mask layer 534, which are located below the horizontal extensions 550h of the butted mask pattern pairs 550b, are exposed.

As the horizontal extensions 550h of the butted mask pattern pairs 550b are removed, portions of the vertical extensions 550v of the butted mask pattern pairs 550b are consumed starting from the upper surfaces thereof. Thus, mask patterns 550c made up of portions of the vertical extensions 550v of the butted mask pattern pairs 550b remaining after the consumption are formed on the second hard mask layer 534.

Referring to FIG. 7B, in a method similar to that described above with reference to FIG. 6E or 4H and FIG. 5F, the local mask patterns 570 are formed in the memory cell region 300A, the contact region 300B, and the peripheral circuit region 300C.

Thereafter, as in the process described above with reference to FIG. 6F or the processes described above with reference to FIGS. 4I, 4J, and 4K, in the memory cell region 300A, the contact region 300B, and the peripheral circuit region 300C on the substrate 500, the second hard mask layer 534 is etched using the mask patterns 550c and the local mask patterns 570 as an etch mask, thereby forming the second hard mask patterns 534a. The first hard mask layer 532 is etched using the second hard mask patterns 534a as an etch mask, thereby forming the first hard mask patterns 532a. The conductive layer 530 is etched using the first hard mask patterns 532a as an etch mask, thereby forming a plurality of first conductive lines 530a for forming a cell array and a plurality of second conductive lines 530b for forming a string selection line SSL and a ground selection line GSL on the substrate 500 within the memory cell region 300A. Simultaneously with the formations of the first and second conductive lines 530a and 530b, a plurality of contact pads 530c integrally connected with the first conductive lines 530a are formed in the contact region 300B, and conductive patterns 530d for peripheral circuits are formed in the peripheral circuit region 300C.

FIGS. 8A through 8I are cross-sectional views for explaining a method of forming fine patterns of the semiconductor device of FIG. 3, according to a fourth embodiment of the present invention.

In FIGS. 8A through 8I, the same reference characters as those of FIGS. 3, 4A through 4K, 5A through 5F, and 6A through 6F denote like elements, and thus their description will be omitted.

Figure 8A:
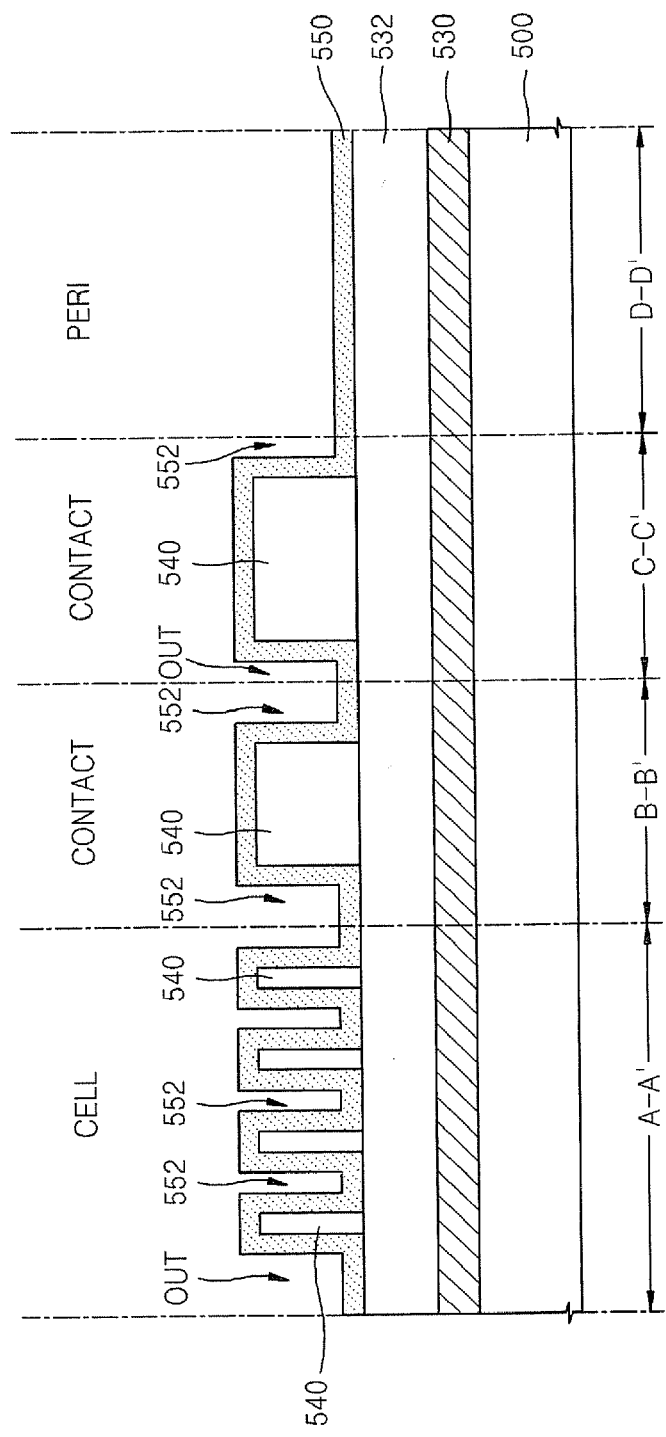

Referring to FIG. 8A, in a method as described above with reference to FIGS. 4A, 5A, and 4B, the conductive layer 530 and the first hard mask layer 532 are sequentially formed on the substrate 500, and the mold mask patterns 540 and the mask layer 550 are then formed on the first hard mask layer 532.

In the present embodiment, formation of the second hard mask layer 534 on the first hard mask layer 532 is omitted, and the mold mask patterns 540 and the mask layer 550 are formed on the first hard mask layer 532. In this regard, the present embodiment differs from the embodiment of FIGS. 4A and 4B.

Figure 8B:
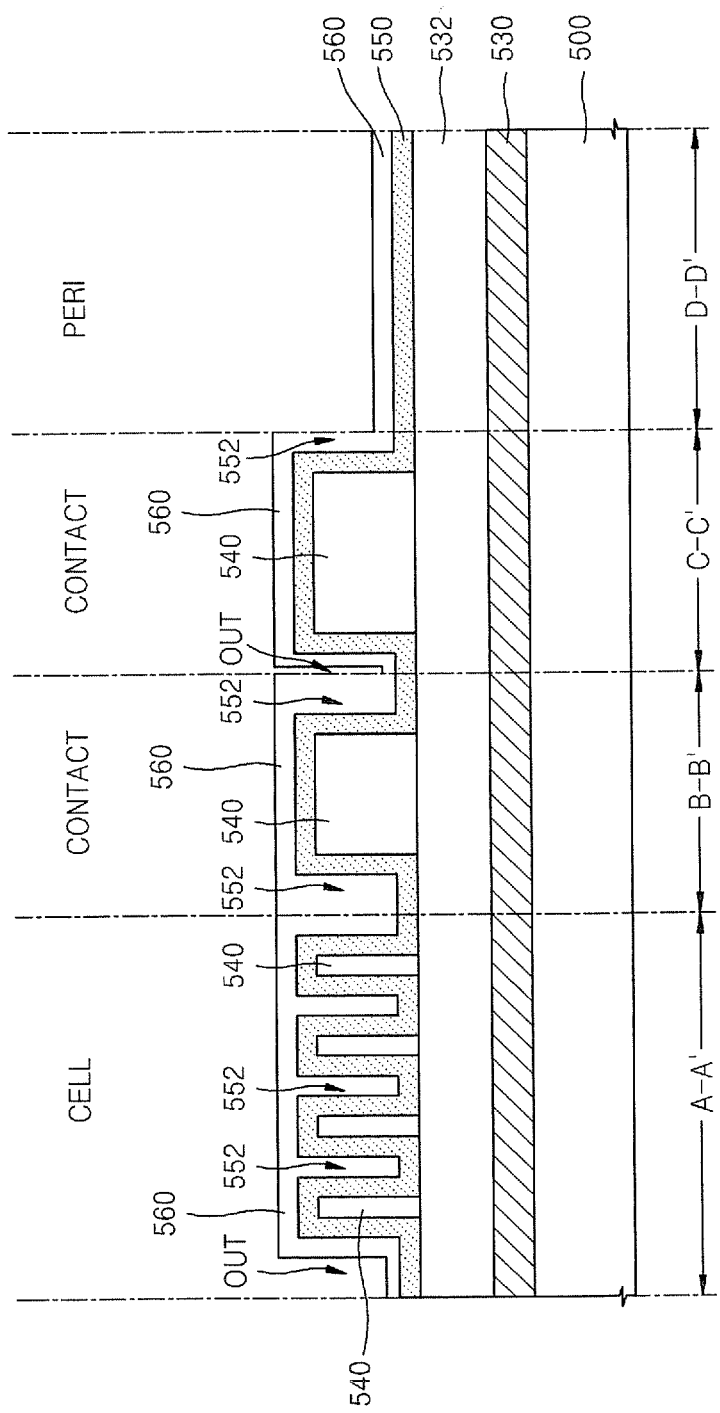

Referring to FIG. 8B, in a method as described above with reference to FIG. 6A, the gap-fill protection film 560 is formed on the mask layer 550.

Figure 8C:
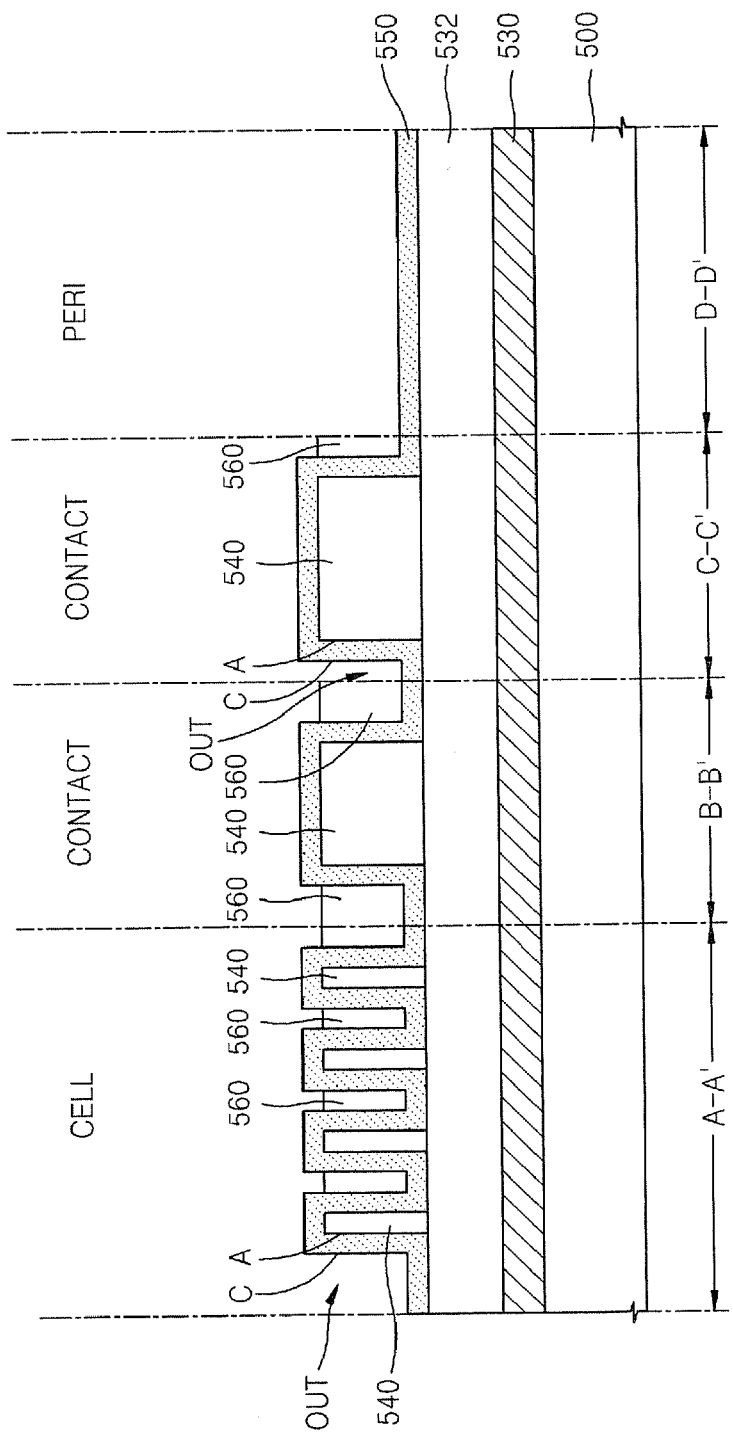

Referring to FIG. 8C, in a method similar to that described above with reference to FIG. 6B, in order to expose the outermost portions C of the mask layer 550, the gap-fill protection film 560 is isotropically etched until the outermost portions C of the mask layer 550 covering portions of the mold mask patterns 540, which provide the outermost sidewalls A of the single mold mask pattern block 540A, and the upper surfaces of the mold mask patterns 540 constituting the single mold mask pattern block 540A, are exposed. Consequently, the gap-fill protection film 560 remains only in the recesses 552 between two adjacent mold mask patterns 540.

Figure 8D:
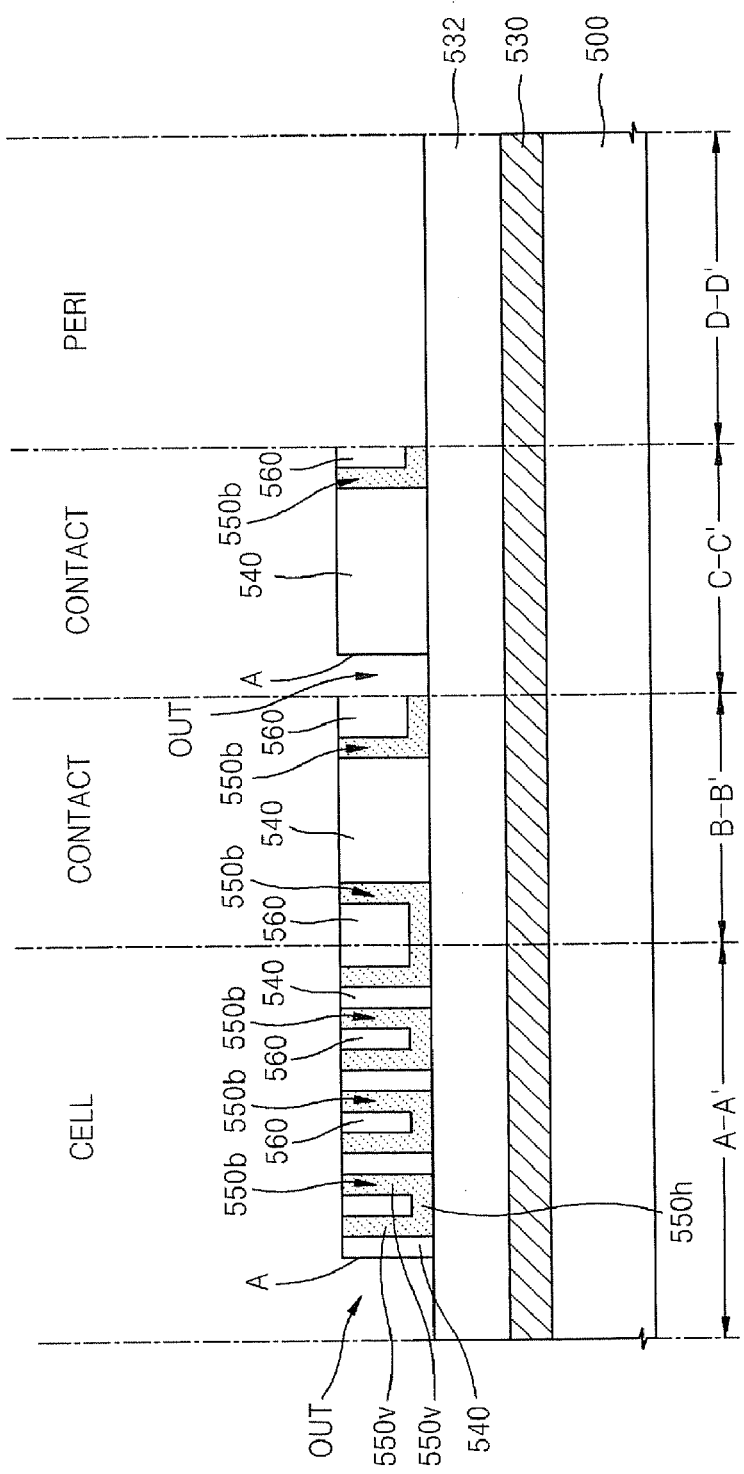

Referring to FIG. 8D, in a method similar to that described above with reference to FIG. 6C, in order to expose the outermost sidewalls A of the mold mask patterns 540, an exposed portion of the mask layer 550 is isotropically etched.

After the outermost sidewalls A of the mold mask patterns 540 are exposed, a plurality of butted mask pattern pairs 550b having cross-sections that are roughly "U" shaped are formed between adjacent two mold mask patterns 540 by portions of the mask layer 550 remaining within the mold mask pattern block 540A. Each of the butted mask pattern pairs 550b includes two vertical extensions 550v covering respective sidewalls of two adjacent mold mask patterns 540 of the mold mask pattern block 540A, and a horizontal extension 550h connecting the two vertical extensions 550v to each other. The upper surfaces of the vertical extensions 550v of the butted mask pattern pairs 550b are exposed between the mold mask patterns 540 and the gap-fill protection film 560.

Figure 8E:
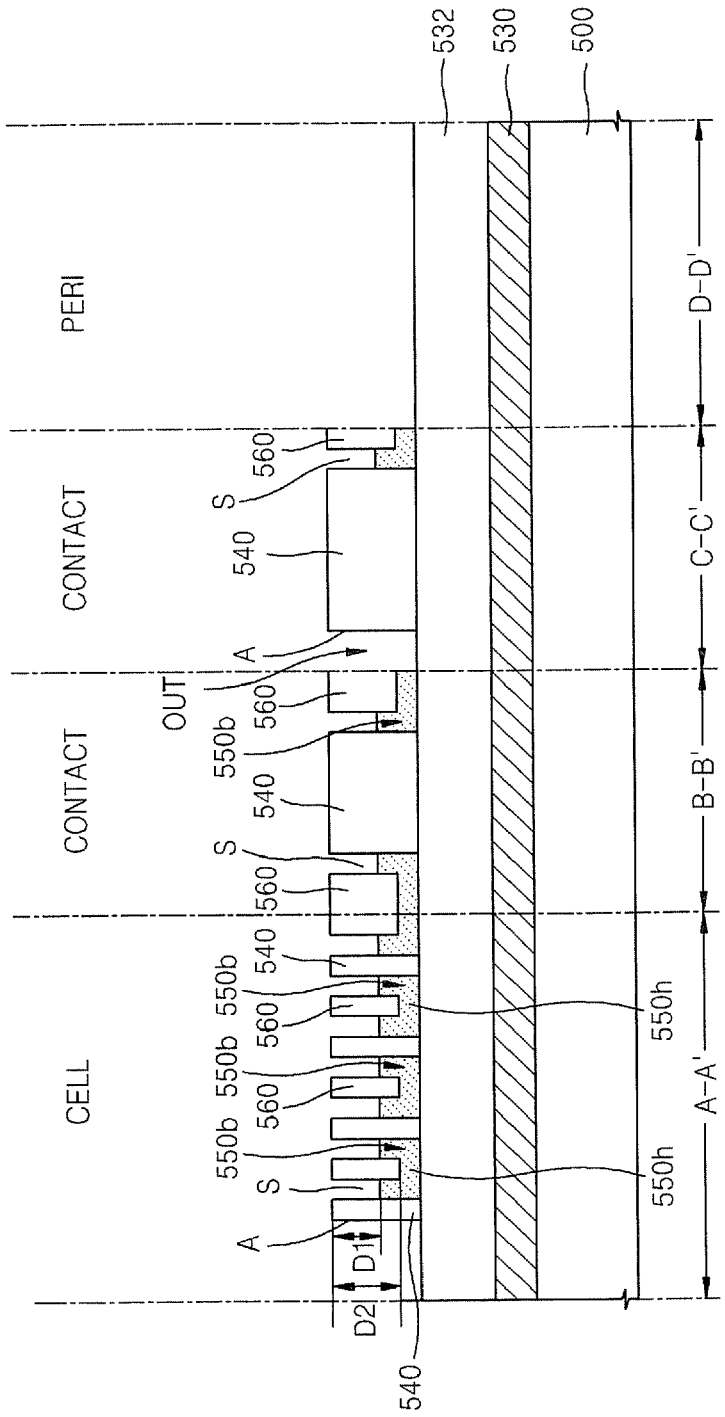

Referring to FIG. 8E, the vertical extensions 550v of the butted mask pattern pairs 550b are removed by a first depth D1 starting from the upper surfaces thereof, thereby forming mask spaces S each having the first depth D1 between the mold mask patterns 540 and the gap-fill protection film 560.

In a resulting structure obtained by the process of FIG. 8E, the first depth D1 of each of the mask spaces S may be rendered to a thickness less than a thickness D2 of the gap-fill protection film 560, and a distance from the substrate 500 to the bottom surface of each of the mask spaces S may be rendered greater than a distance from the substrate 500 to the bottom surface of the gap-fill protection film 560. This is because when the first depth D1 is equal to or greater than the thickness D2 of the gap-fill protection film 560, the gap-fill protection film 560 may collapse without maintaining its shape.

In order to remove the vertical extensions 550v by the first depth D1 starting from the upper surfaces thereof, a wet-etching or dry-etching process may be used. For example, when the butted mask pattern pairs 550b are formed of nitride, the vertical extensions 550v may be removed by the first depth D1 starting from the upper surfaces thereof by using a wet-etching process using a phosphoric acid solution as an etch solution.

Referring to FIG. 8F, the second hard mask layer 834 is formed on the mold mask patterns 540, the gap-fill protection film 560, and the butted mask pattern pairs 550b.

The second hard mask layer 834 completely covers the mold mask patterns 540 and the gap-fill protection film 560 while completely filling mask spaces S between the mold mask patterns 540 and the gap-fill protection film 560 over the vertical extensions 550v of the butted mask pattern pairs 550b.

The second hard mask layer 834 is formed of a material having an etching selectivity different from those of materials of the first hard mask layer 532, the mold mask pattern 540, the gap-fill protection film 560, and the butted mask pattern pairs 550b. For example, when the first hard mask layer 532, the mold mask pattern 540, and the gap-fill protection film 560 are formed of oxide and the butted mask pattern pairs 550b are formed of nitride, the second hard mask layer 834 may be formed of polysilicon.

Figure 8G:
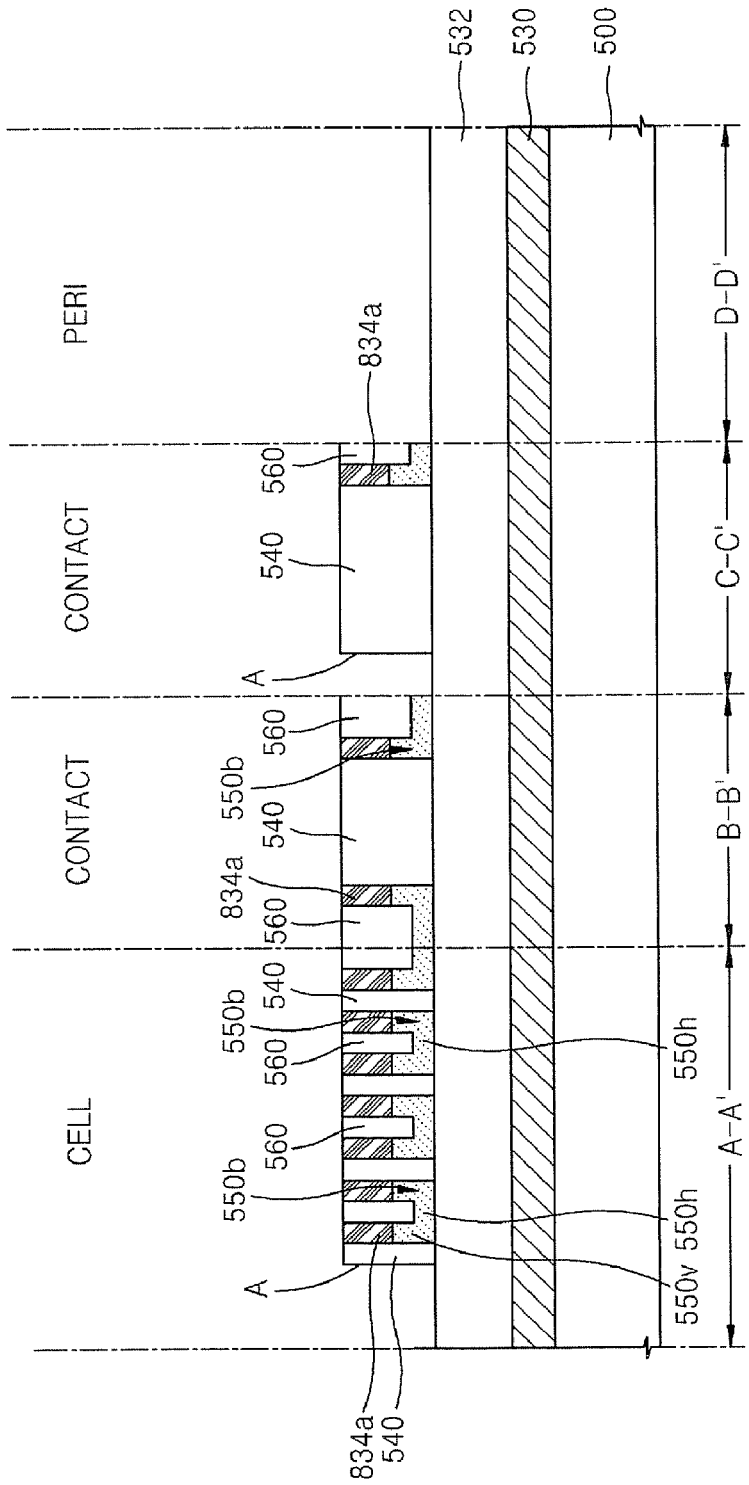

Referring to FIG. 8G, by isotropically etching the second hard mask layer 834, portions of the mold mask patterns 540, which provide outermost sidewalls A of the single mold mask pattern block 540A, constituting the single mold mask pattern block 540A are exposed, and upper surfaces of the mold mask patterns 540 and the gap-fill protection film 560 are simultaneously exposed. The isotropical etching may be wet or dry etching.

Consequently, in the memory cell region 300A and the contact region 300B on the substrate 500, a plurality of second hard mask patterns 834a with which the mask spaces S between the mold mask patterns 540 and the gap-fill protection film 560 are filled, are formed.

Figure 8H:
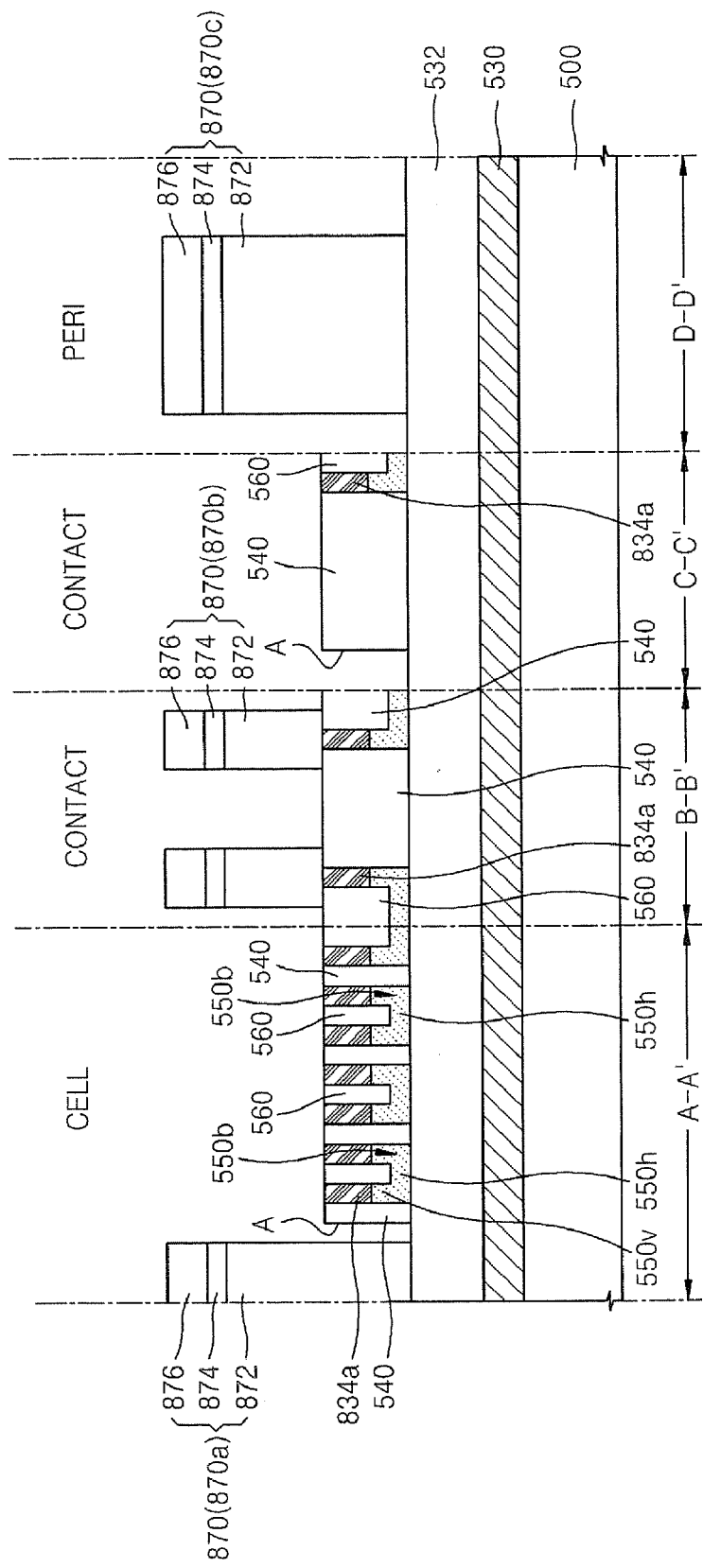

Referring to FIG. 8H, in a method similar to that of forming the local mask patterns 570 described above with reference to FIG. 6E, local mask patterns 870 are formed within the memory cell region 300A, the contact region 300B, and the peripheral circuit region 300C.

The local mask patterns 870 include a plurality of first local mask patterns 870a for forming a plurality of string selection lines SSL and a plurality of ground selection lines GSL within the memory cell region 300A, a plurality of second local mask patterns 870b for forming the contact pads 352 within the contact region 300B, and a plurality of third local mask patterns 870c for forming unit elements required to constitute a peripheral circuit, for example, the conductive patterns 372 for peripheral circuits of FIG. 3, within the peripheral circuit region 300C.

For example, each of the local mask patterns 870 may be a stack of a carbon-contained film pattern 872, an SiON pattern 874, and a photoresist pattern 876 which are formed by coating. In order to form these local mask patterns 870, the following process may be performed. First, after a carbon-contained film is formed on a resultant structure of FIG. 8G, on which the second hard mask patterns 834a have been formed, by spin coating, an SiON film is formed to a thickness of about 100~500 Å on the carbon-contained film, and the photoresist pattern 876 is formed on the SiON film. Thereafter, the SiON pattern 874 and the carbon-contained film pattern 872 are formed by sequentially etching the SiON film and the carbon-contained film using the photoresist pattern 876 as an etch mask. The SiON film may serve as an anti-reflective film and may also serve as a hard mask when an underlayer below the SiON film is etched.

The carbon-contained film pattern 872 may be obtained from an organic compound comprised of a hydrocarbon compound including aromatic rings or its derivative. For example, the carbon-contained film pattern 872 may be obtained from a material having a high carbon content, that is, about 85~99% by weight of carbon based on a total weight of an organic material made up of an organic compound including aromatic rings such as phenyl, benzene, or naphthalene. In the process of forming the carbon-contained film, after an organic compound composed of a material as described above is spin coated to a thickness of about 1000~5000 Å on the resultant structure of FIG. 8G on which the second hard mask patterns 834a have been formed, an obtained organic compound layer is primarily baked at a temperature of about 150~350° C. to thereby form the carbon-contained film. The primary baking may be performed for about 60 seconds. Thereafter, the carbon-contained film is secondarily baked at a temperature of about 300~550° C. to be hardened. The secondary baking may be performed for about 30~300 seconds. As described above, by hardening the carbon-contained film according to a secondary baking process, even when deposition is performed at a relatively high temperature, that is, about 400° C. or greater in order to form another film, for example, the SiON film, on the carbon-contained film, this evaporation does not adversely affect the carbon-contained film.

Figure 8I:
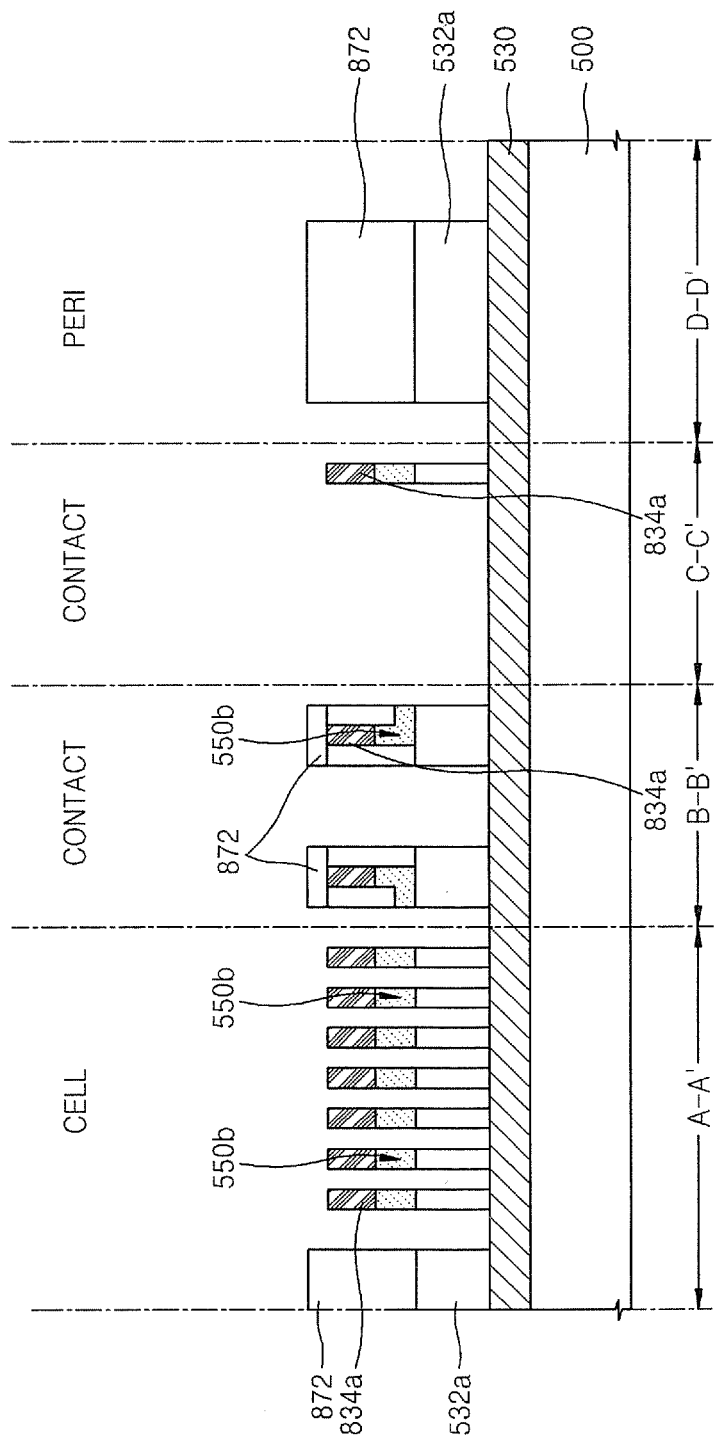

Referring to FIG. 8I, in the memory cell region 300A, the contact region 300B, and the peripheral circuit region 300C on the substrate 500, the exposed mold mask patterns 540 and the exposed gap-fill protection film 560 are anisotropically etched using the local mask patterns 870 and the second hard mask patterns 834a as an etch mask. Then, portions of the horizontal extensions 550h of the butted mask pattern pairs 550b and the first hard mask layer 532 below the portions of the horizontal extensions, which are exposed by removing the mold mask patterns 540 and the gap-fill protection film 560 by the above-described anisotropical etching, are consecutively etched using the local mask patterns 870 and the second hard mask patterns 834a as an etch mask, thereby forming a plurality of first hard mask patterns 532a.

During the etching process for forming the first hard mask patterns 532a, the photoresist patterns 876 and the SiON patterns 874 may be partially or entirely consumed. The carbon-contained film patterns 872 may be partially or entirely consumed.

Thereafter, after unnecessary films are removed when needed, the conductive layer 530 is etched using the first hard mask patterns 532a as an etch mask in the memory cell region 300A, the contact region 300B, and the peripheral circuit region 300C on the substrate 500. Consequently, a plurality of first conductive lines 530a for forming a cell array and a plurality of second conductive lines 530b for forming the string selection line SSL and the ground selection line GSL are formed within the memory cell region 300A, a plurality of contact pads 530c integrally connected to the first conductive lines 530a are formed within the contact region 300B, and conductive patterns 530d for peripheral circuits are formed within the peripheral circuit region 300C.

In a method of forming fine patterns of a semiconductor device according to the present invention, a plurality of conductive lines extending parallel to each other in order to form a cell array of a highly-integrated semiconductor device, and a plurality of contact pads integrally connected with respective ends of the conductive lines in a contact region in order to connect the conductive lines to an external circuit such as a decoder are formed by etching a conductive layer below mask spacers formed around a plurality of mold mask patterns by using the mask spacers as an etch mask. When trimming for removing unnecessary portions of the mask spacers is performed, photolithography, which requires expensive equipment and mask patterns having a complicated layout, does not need to be performed. The mask spacer trimming may be achieved using a simple and economic process.

In addition, in the method of forming fine patterns of a semiconductor device according to the present invention, in order to form the contact pads for peripheral circuit connections at ends of the conductive lines simultaneously with the formation of the conductive lines, first, mold mask patterns are formed to form etch mask patterns required to etch the conductive layer on a substrate. Then, spacers are formed on sidewalls of the mold mask patterns, and the conductive layer is then etched using the spacers as an etch mask to thereby form the conductive lines. Accordingly, a critical dimension may be uniformly obtained when fine mask patterns are formed. Thus, when word lines of the semiconductor device are formed from the conductive lines, gate channel lengths may be uniformly established over all of the word lines, and each memory cell can uniformly control a threshold voltage.

Moreover, in the method of forming fine patterns of a semiconductor device according to the present invention, {(N+2)/2} mold mask patterns are formed within a cell block constituting a single cell string, in order to form N parallel conductive lines, namely, N mask spacers, within the cell block. For example, in order to form 32 parallel conductive lines on a substrate within a single cell block, 17 mold mask patterns are first formed on the substrate. In other words, an even number of conductive lines are obtained regardless of whether either an odd or even number of mold mask patterns exist within the single cell block. Therefore, when word lines in a memory cell array region are formed from the conductive lines, a layout capable of securing cells, the number of which is $2^n$ times the total number of word lines, may be designed without needing to form unnecessary word lines on the substrate. Thus, an area on the substrate where the unnecessary word lines are to be formed is reduced, leading to efficient utilization of a valid area on the substrate.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of forming fine patterns of a semiconductor device, the method comprising:

forming a mold mask pattern block by arranging a plurality of mold mask patterns parallel to each other within a cell block on a substrate comprising a film which is to be etched, wherein each of the mold mask patterns comprises a first portion extending in a first direction and a second portion which is integrally formed with the first portion and extends in a second direction different from the first direction;

forming a first mask layer covering sidewalls and an upper surface of each of the plurality of mold mask patterns, on the substrate, wherein the first mask layer comprises two vertical extensions covering sidewalls of adjacent mold mask patterns by being located between the adjacent mold mask patterns and a horizontal extension formed on the film to be etched between the two vertical extensions so that the two vertical extensions are connected to each other, wherein after the first mask layer is formed, recesses having widths each defined by two vertical extensions connected to a horizontal extension of the first mask layer are formed on the horizontal extension between adjacent mold mask patterns of the plurality of mold mask patterns; and forming first mask patterns, comprising:

partially removing the first mask layer so that a first area of the first mask layer remains and a second area of the first mask layer is removed, wherein the first area of the first mask layer covers sidewalls of adjacent mold mask patterns from among the plurality of mold mask patterns by being located between the adjacent mold mask patterns, and the second area of the first mask layer covers portions of the sidewalls of the plurality of mold mask patterns, the portions corresponding to an outermost sidewall of the mold mask pattern block;

forming a gap-fill protection film which fills the recesses by being located between the two adjacent mold mask patterns, after the first mask layer is formed;

removing a portion of the first mask layer, which is not covered by the gap-fill protection film;

forming mask spaces each having a first depth between the mold mask patterns and the gap-fill protection film, by partially removing the vertical extensions of the mask layer starting from upper surfaces of the vertical extensions, when the gap-fill protection film remains in the recesses; and forming upper mask patterns within the mask spaces.

2. The method of claim 1, wherein:
the first mask layer is formed of nitride; and
the gap-fill protection film and the plurality of mold mask patterns are formed of oxide.

3. The method of claim 1, wherein in the forming of the mask spaces, the vertical extensions of the first mask layer are removed so that a distance from the substrate to a bottom surface of each of the mask spaces is greater than a distance from the substrate to a bottom surface of the gap-fill protection film.

4. The method of claim 1, wherein the upper mask patterns are formed of a material different from materials used to form the mold mask patterns, the gap-fill protection film, and the first mask layer.

5. The method of claim 1, further comprising etching the mold mask patterns, the gap-fill protection film, and the horizontal extensions of the first mask layer by using the upper mask patterns as an etch mask.

6. The method of claim 5, further comprising etching the film that is to be etched, by using the upper mask patterns as an etch mask.

7. The method of claim 1, further comprising forming second mask patterns comprising first local patterns and second local patterns on the substrate after the first mask patterns are formed, wherein the first local patterns do not cover the first mask patterns and the second local patterns cover the first mask patterns.

8. The method of claim 7, wherein:
the substrate comprises a memory cell region, a peripheral circuit region, and a contact region located between the memory cell region and the peripheral circuit region;
the first local patterns of the second mask patterns are formed in the memory cell region and the peripheral circuit region; and
the second local patterns of the second mask patterns are formed in the contact region.

9. The method of claim 7, further comprising completely removing the plurality of mold mask patterns after the first mask patterns are formed but before the second mask patterns are formed.

10. The method of claim 7, wherein the forming of the second mask patterns comprises forming photoresist patterns on the first mask patterns.

11. The method of claim 7, wherein the forming of the second mask patterns comprises:
forming a carbon-contained film on each of the first mask patterns by spin coating; hardening the carbon-contained films by baking; and
forming a photoresist pattern on each of the carbon-contained films.

12. The method of claim 11, further comprising forming an anti-reflective film on each of the hardened carbon-contained films, before forming the photoresist pattern on each of the carbon-contained films, wherein the photoresist patterns are formed on the carbon-contained films.

13. The method of claim 7, further comprising etching the film that is to be etched, by using the first and second mask patterns as an etch mask.

14. The method of claim 7, wherein the forming of the second mask patterns uses photolithography.

15. The method of claim 7, wherein:
the first mask patterns are comprised of a plurality of mask spacers that cover sidewalls of adjacent mold mask patterns of the plurality of mold mask patterns by being located between the adjacent mold mask patterns; and
adjacent mask spacers between the adjacent mold mask patterns are separated apart from each other by having a space exposing the film that is to be etched between the adjacent mask spacers.

16. The method of claim 15, wherein to form N mask spacers (where N is a natural number) within the cell block in the forming of the first mask patterns, a mold mask pattern block comprising $\{(N+2)/2\}$ mold mask patterns is formed within the cell block in the forming of the mold mask pattern block.

17. The method of claim 1, wherein the film that is to be etched comprises a conductive layer formed on the substrate.

18. The method of claim 1, wherein the film that is to be etched comprises a conductive layer and a hard mask layer sequentially formed on the substrate.

19. The method of claim 18, wherein the hard mask layer comprises a single layer comprising one of an oxide film, a nitride film, and a polysilicon film.

20. The method of claim 18, wherein the hard mask layer comprises a double layer comprising two of an oxide film, a nitride film, and a polysilicon film.

21. The method of claim 1, wherein photolithography is not used after the formation of the first mask layer until the formation of the second mask patterns.

22. The method of claim 1, wherein in the forming of the first mask patterns, the second area of the first mask layer is etched when the first area of the mask layer is covered with the gap-fill protection film.

23. The method of claim 22, wherein dry etching is performed to form the first mask patterns.

24. The method of claim 22, wherein wet etching is performed to form the first mask patterns.

25. The method of claim 1, wherein in the plurality of mold mask patterns, widths of the second portions extending in a direction perpendicular to the second direction are greater than widths of the first portions extending in a direction perpendicular to the first direction.

26. The method of claim 1, wherein the second direction is perpendicular to the first direction.

27. A method of forming fine patterns of a semiconductor device, the method comprising:
forming a mold mask pattern block by arranging a plurality of mold mask patterns parallel to each other within a cell block on a substrate comprising a film which is to be etched, wherein each of the mold mask patterns comprises a first portion extending in a first direction and a second portion which is integrally formed with the first portion and extends in a second direction different from the first direction;

forming a first mask layer covering sidewalls and an upper surface of each of the plurality of mold mask patterns, on the substrate; and forming first mask patterns by partially removing the first mask layer so that a first area of the first mask layer remains and a second area of the first mask layer is removed, wherein the first area of the first mask layer covers sidewalls of adjacent mold mask patterns from among the plurality of mold mask patterns by being located between the adjacent mold mask patterns, and the second area of the first mask layer covers portions of the sidewalls of the plurality of mold mask patterns, the portions corresponding to an outermost sidewall of the mold mask pattern block, wherein the first mask patterns comprise two vertical extensions that cover sidewalls of adjacent mold mask patterns of the plurality of mold mask patterns by being located between the adjacent mold mask patterns, and a horizontal extension formed on the film that is to be etched between the two vertical extensions so that the two vertical extensions are connected to each other;

forming mask spaces exposing sidewalls of the mold mask patterns by partially removing the vertical extensions of the first mask patterns starting from upper surfaces of the vertical extensions;

forming upper mask patterns within the mask spaces; and forming second mask patterns comprising first local patterns and second local patterns on the substrate after the first mask patterns are formed, wherein the first local patterns do not cover the first mask patterns and the second mask patterns cover the first mask patterns.

* * * * *